(12) United States Patent
Kim et al.

(10) Patent No.: US 12,323,751 B2
(45) Date of Patent: Jun. 3, 2025

(54) DISPLAY APPARATUS

(71) Applicant: LG Display Co., Ltd., Seoul (KR)

(72) Inventors: Taeheon Kim, Paju-si (KR); Chiwan Kim, Paju-si (KR); Sung-Eui Shin, Paju-si (KR); YongWoo Lee, Paju-si (KR); Kyungyeol Ryu, Paju-si (KR); YuSeon Kho, Paju-si (KR); YongGyoon Jang, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 18/211,583

(22) Filed: Jun. 19, 2023

(65) Prior Publication Data

US 2023/0345156 A1    Oct. 26, 2023

Related U.S. Application Data

(63) Continuation of application No. 17/746,959, filed on May 18, 2022, now Pat. No. 11,770,645, which is a
(Continued)

(30) Foreign Application Priority Data

Nov. 13, 2018    (KR) .................. 10-2018-0139194

(51) Int. Cl.
*H04R 1/02*        (2006.01)
*H04R 17/00*       (2006.01)
(Continued)

(52) U.S. Cl.
CPC ............ *H04R 1/028* (2013.01); *H04R 17/00* (2013.01); *H10N 30/20* (2023.02);
(Continued)

(58) Field of Classification Search
None
See application file for complete search history.

(56) References Cited

U.S. PATENT DOCUMENTS 5,684,884 A * 11/1997 Nakaya .................. H04R 17/00
                                                         310/322
9,571,937 B2     2/2017 Ogata et al.
(Continued)

FOREIGN PATENT DOCUMENTS

CN     201207727 Y      3/2009
CN     103240220 A      8/2013
(Continued)

OTHER PUBLICATIONS

Office Action dated Jul. 1, 2023, issued in corresponding Korean Patent Application No. 10-2018-0139194.
(Continued)

*Primary Examiner* — Kenny H Truong
(74) *Attorney, Agent, or Firm* — Morgan, Lewis & Bockius LLP

(57) ABSTRACT

A display apparatus includes a display panel configured to display an image and a sound generating device on a rear surface of the display panel. The sound generating device is configured to vibrate the display panel to generate sound. The sound generating device includes a first structure and a first passivation layer on one side of the first structure, at least a portion of the first passivation layer having a non-flat shape.

35 Claims, 24 Drawing Sheets

Related U.S. Application Data continuation of application No. 17/177,058, filed on Feb. 16, 2021, now Pat. No. 11,368,771, which is a continuation of application No. 16/662,690, filed on Oct. 24, 2019, now Pat. No. 10,972,820.

(51) Int. Cl.
- *H10N 30/20* (2023.01)
- *H10N 30/857* (2023.01)
- *H10N 30/88* (2023.01)
- *H10N 39/00* (2023.01)

(52) U.S. Cl.
CPC ......... *H10N 30/857* (2023.02); *H10N 30/883* (2023.02); *H10N 39/00* (2023.02); *H04R 2499/15* (2013.01)

(56) References Cited

U.S. PATENT DOCUMENTS

| | | |
|---|---|---|
| 9,761,784 B2 | 9/2017 | Miyoshi |
| 10,009,683 B2 | 6/2018 | Choi et al. |
| 10,972,820 B2 | 4/2021 | Kim et al. |
| 11,368,771 B2 | 6/2022 | Kim et al. |
| 2007/0019134 A1 | 1/2007 | Park et al. |
| 2007/0241840 A1 | 10/2007 | Takayama et al. |
| 2010/0166232 A1 | 7/2010 | Liu et al. |
| 2014/0210309 A1 | 7/2014 | Miyoshi |
| 2015/0016640 A1 | 1/2015 | Inagaki |
| 2015/0139456 A1 | 5/2015 | Okamura et al. |
| 2015/0343492 A1 | 12/2015 | Hajati |
| 2016/0050498 A1 | 2/2016 | Ogata et al. |
| 2017/0280234 A1 | 9/2017 | Choi et al. |
| 2017/0287990 A1 | 10/2017 | Choi et al. |

FOREIGN PATENT DOCUMENTS

| | | |
|---|---|---|
| CN | 103843367 A | 6/2014 |
| CN | 104137570 A | 11/2014 |
| CN | 105122839 A | 12/2015 |
| CN | 106406432 A | 2/2017 |
| CN | 106457307 A | 2/2017 |
| CN | 108124218 A | 6/2018 |
| EP | 0685985 A2 | 12/1995 |
| EP | 3 330 780 A1 | 6/2018 |
| JP | S61205099 A | 9/1986 |
| JP | 4717131 B2 | 7/2011 |
| KR | 10-2014-0068121 A | 6/2014 |
| KR | 10-1704517 B1 | 2/2017 |
| KR | 10-2017-0115003 A | 10/2017 |

OTHER PUBLICATIONS

First Notification of Office Action dated Oct. 19, 2020, issued in corresponding Chinese Patent Application No. 201911044398.8.

Office Action dated Oct. 26, 2022 in counterpart Chinese Patent Application No. 202110785487.9.

Office Action dated Jan. 30, 2024, issued in corresponding Korean Patent Application No. 10-2024-0009550.

Office Action dated May 8, 2023, issued in corresponding Chinese Divisional Patent Application No. 202110785487.9.

* cited by examiner

DISPLAY APPARATUS

CROSS-REFERENCE TO RELATED APPLICATIONS

This application is a Continuation of U.S. patent application Ser. No. 17/746,959, filed on May 18, 2022, which is a Continuation of U.S. patent application Ser. No. 17/177,058, filed on Feb. 16, 2021, now U.S. Pat. No. 11,368,771, which is a Continuation of U.S. patent application Ser. No. 16/662,690, filed on Oct. 24, 2019, now U.S. Pat. No. 10,972,820, which claims the benefit of and priority to Korean Patent Application No. 10-2018-0139194, filed on Nov. 13, 2018. The entirety of each of the above prior U.S. and Korean patent applications is hereby incorporated by reference.

BACKGROUND

Technical Field

The present disclosure relates to a display apparatus, and more particularly, to a display apparatus configured to vibrate a display panel to generate sound.

Discussion of the Related Art

Recently, as society advances toward an information-oriented society, the field of display apparatuses for visually displaying an electrical information signal has rapidly advanced. Consequently, various display apparatuses having excellent performance, such as thinness, light weight, and low power consumption, are being developed.

Examples of the display apparatuses may include liquid crystal display (LCD) apparatuses, field emission display (FED) apparatuses, organic light emitting display apparatuses, light emitting diode display apparatuses, quantum dot light emitting display apparatuses, and micro light emitting diode display apparatuses.

The LCD apparatuses include an array substrate including a thin film transistor (TFT), an upper substrate including a color filter and/or a black matrix, and a liquid crystal layer between the array substrate and the upper substrate. The LCD apparatuses are apparatuses in which an alignment state of the liquid crystal layer is adjusted with an electric field generated between two electrodes provided in a pixel area, and a transmittance of light is adjusted based on the alignment state, thereby displaying an image.

The organic light emitting display apparatuses, which are self-emitting devices, have low power consumption, a fast response time, high emission efficiency, excellent luminance, and a wide viewing angle.

Display apparatuses may include a display panel which displays an image and a sound device which outputs a sound along with an image. In the display apparatuses, a sound generated by the sound device travels toward a rear surface of the display panel or toward a region under the display panel, instead of toward a front surface of the display panel. Therefore, sound quality is degraded due to interference of a sound reflected from a wall or a floor. For this reason, it is difficult to provide a clear sound from the sound device without hindering an immersion experience of a user.

Moreover, in a case where a speaker included in a set apparatus such as a television (TV), a computer monitor, a notebook computer, or a desktop personal computer (PC) is provided, the speaker occupies a certain space, and due to this, the design and space disposition of the set apparatus are limited.

A speaker applied to display apparatuses may be, for example, an actuator including a magnet and a coil. However, when the actuator is applied to the display apparatuses, a thickness thereof is thick. Piezoelectric elements that enable a thin thickness to be implemented are attracting much attention. Since the piezoelectric elements have a fragile characteristic, the piezoelectric elements are easily damaged by an external impact, and due to this, the reliability of sound reproduction is low.

SUMMARY

Accordingly, embodiments of the present disclosure are directed to a display apparatus that substantially obviates one or more of the problems due to limitations and disadvantages of the related art.

Therefore, the present inventors have recognized the above-described problems and have invented a display apparatus having a new structure, which includes a sound generating device having a thin thickness for realizing a thin thickness of the display apparatus and decreases an influence of an external impact.

An aspect of the present disclosure is to provide a display apparatus including a sound generating device for decreasing an influence of an external impact and enhancing a sound characteristic.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivabel therefrom, and the claims hereof as well as the appended drawings.

To achieve these and other aspects of the inventive concepts as embodied and broadly described herein, a display apparatus comprises a display panel configured to display an image and a sound generating device on a rear surface of the display panel, the sound generating device being configured to vibrate the display panel to generate sound, wherein the sound generating device includes a first structure and a first passivation layer on one side of the first structure, at least a portion of the first passivation layer having a non-flat shape.

In another aspect, a display apparatus comprises a display panel including a display area configured to display an image and a non-display area surrounding the display area and a sound generating device on a rear surface of the display panel, the sound generating device being configured to vibrate the display panel to generate sound, wherein the sound generating device includes a first structure including a first part having a piezoelectric characteristic and a second part between adjacent first parts to have flexibility and a passivation layer on or under the first structure, the passivation layer including a plurality of concave portions.

A display apparatus according to an embodiment of the present disclosure may include the sound generating device including the first structure and the second structure, and thus, may secure the impact resistance and flexibility of the sound generating device. Accordingly, a display apparatus having an excellent vibration characteristic and an excellent sound characteristic may be provided.

Moreover, the display apparatus according to an embodiment of the present disclosure may include the sound generating device including the first structure and the second structure, and thus, may decrease an influence of an external impact. Accordingly, a sound generating device with enhanced flexibility and sound pressure level may be provided, and thus, may be applied to a flexible display apparatus.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with embodiments of the disclosure. It is to be understood that both the foregoing general description and the following detailed description of the present disclosure are examples and explanatory and are intended to provide further explanation of the disclosure as claimed.

BRIEF DESCRIPTION OF THE DRAWINGS

The accompanying drawings, that may be included to provide a further understanding of the disclosure and are incorporated in and constitute a part of this application, illustrate embodiments of the disclosure and together with the description serve to explain various principles of the disclosure.

Figure 1:
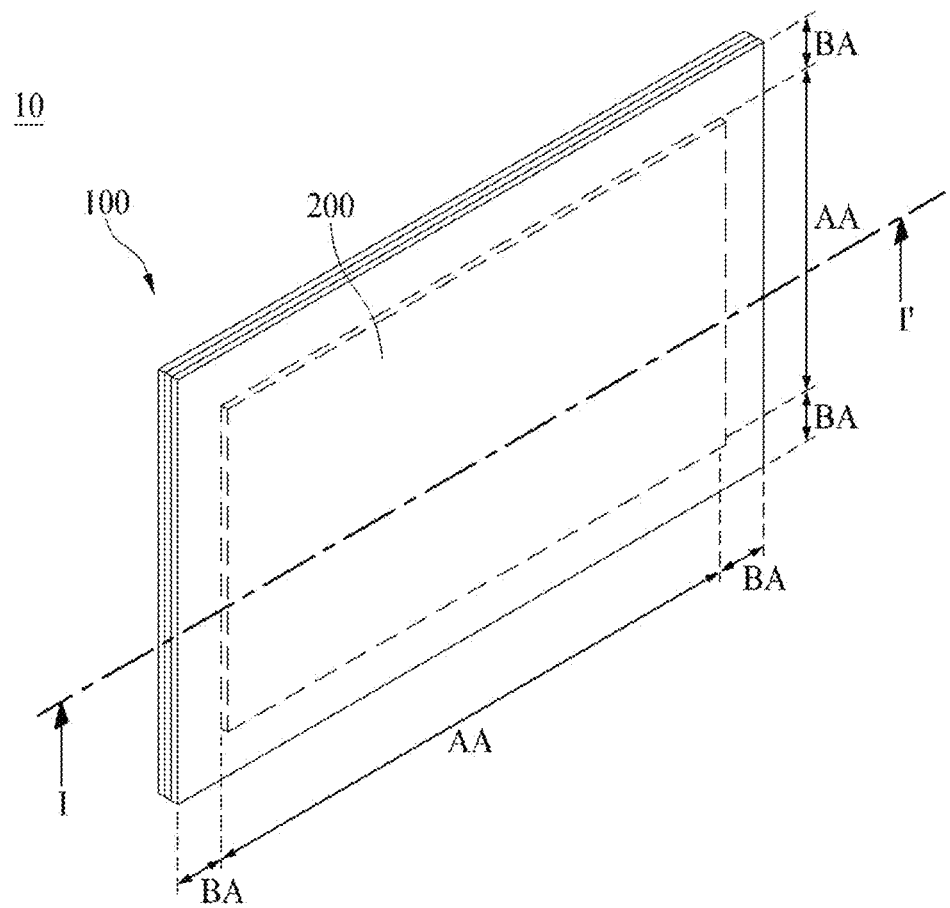
FIG. 1 illustrates a display apparatus including a sound generating device according to an embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to the exemplary embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. In a case where "comprise," "have," and "include," described in the present specification are used, another part may be added unless "only" is used. The terms of a singular form may include plural forms unless referred to the contrary.

In construing an element, the element is construed as including an error range although there is no explicit description.

In describing a position relationship, for example, when a position relation between two parts is described as "on," "over," "under," and "next," one or more other parts may be disposed between the two parts unless "just" or "direct(ly)" is used.

In describing a time relationship, for example, when the temporal order is described as "after," "subsequent," "next," and "before," a case which is not continuous may be included unless "just" or "direct(ly)" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing the elements of the present disclosure, terms such as "first," "second," "A," "B," "(a)," "(b)," etc., may be used. Such terms are used for merely discriminating the corresponding elements from other elements and the corresponding elements are not limited in their essence, sequence, or precedence by the terms. It will be understood that when an element or layer is referred to as being "on" or "connected to" another element or layer, it can be directly on or directly connected to the other element or layer, or intervening elements or layers may be present. Also, it should be understood that when one element is disposed over or under another element, this may denote a case where the elements are disposed to directly contact each other, but may denote that the elements are disposed without directly contacting each other.

The term "at least one" should be understood as including any and all combinations of one or more of the associated listed elements. For example, the meaning of "at least one of a first element, a second element, and a third element" denotes the combination of all elements proposed from two or more of the first element, the second element, and the third element as well as the first element, the second element, or the third element.

Features of various embodiments of the present disclosure may be partially or overall coupled to or combined to each other, and may be variously inter-operated to each other and driven technically as those skilled in the art can sufficiently understand. The embodiments of the present disclosure may be carried out independently from each other, or may be carried out together in co-dependent relationship.

In the present disclosure, examples of a display apparatus may include a narrow-sense display apparatus such as an organic light emitting display (OLED) module or a liquid crystal module (LCM) including a display panel and a driver for driving the display panel. Also, examples of the display apparatus may include a set device (or a set apparatus) or a set electronic device (or a set electronic apparatus) such as a notebook computer, a television (TV), a computer monitor, an equipment apparatus including an automotive apparatus or another type apparatuses for vehicles, or a mobile electronic apparatus such as a smartphone or an electronic pad, which is a complete product (or a final product) including an LCM or an OLED module.

Therefore, in the present disclosure, examples of the display apparatus may include a narrow-sense display apparatus itself, such as an LCM or an OLED module, and a set apparatus which is a final consumer apparatus or an application product including the LCM or the OLED module.

In some embodiments, an LCM or an OLED module including a display panel and a driver may be referred to as a narrow-sense display apparatus, and an electronic device which is a final product including an LCM or an OLED module may be referred to as a set device. For example, the narrow-sense display apparatus may include a display panel, such as an LCD or an OLED, and a source printed circuit board (PCB) that is a controller for driving the display panel. The set device may further include a set PCB that is a set controller electrically connected to the source PCB to overall control the set device.

A display panel applied to an embodiment of the present disclosure may use any type of display panel, such as a liquid crystal display panel, an organic light emitting diode (OLED) display panel, and an electroluminescent display panel, but is not limited to a specific display panel that is vibrated by a sound generation device according to an embodiment of the present disclosure to output a sound. Also, a shape or a size of a display panel applied to a display apparatus according to an embodiment of the present disclosure is not limited.

For example, if the display panel is the liquid crystal display panel, the display panel may include a plurality of gate lines, a plurality of data lines, and a plurality of pixels respectively provided in a plurality of pixel areas defined by intersections of the gate lines and the data lines. Also, the display panel may include an array substrate including a thin film transistor (TFT), which is a switching element for adjusting a light transmittance of each of the plurality of pixels, an upper substrate including a color filter and/or a black matrix, and a liquid crystal layer between the array substrate and the upper substrate.

Moreover, if the display panel is the organic light emitting display panel, the display panel may include a plurality of gate lines, a plurality of data lines, and a plurality of pixels respectively provided in a plurality of pixel areas defined by intersections of the gate lines and the data lines. Also, the display panel may include an array substrate including a TFT which is an element for selectively applying a voltage to each of the pixels, an organic light emitting device layer on the array substrate, and an encapsulation substrate disposed on the array substrate to cover the organic light emitting device layer. The encapsulation substrate may protect the TFT and the organic light emitting device layer from an external impact and may prevent water or oxygen from penetrating into the organic light emitting device layer. Also, a layer provided on the array substrate may include an inorganic light emitting layer (for example, a nano-sized material layer, a quantum dot, or the like). As another example, the layer provided on the array substrate may include a micro light emitting diode.

The display panel may further include a backing such as a metal plate attached to the display panel. However, embodiments are not limited to the metal plate, and the display panel may include another structure.

In the present disclosure, the display panel may be applied to vehicles as a user interface module such as a central control panel for automobiles. For example, the display panel may be provided between occupants sitting on two front seats in order for a vibration of the display panel to be transferred to the inside of a vehicle. Therefore, an audio experience in a vehicle is improved in comparison with a case where speakers are disposed on interior sides of the vehicle.

Hereinafter, embodiments of the present disclosure will be described in detail with reference to the accompanying drawings.

Figure 2:
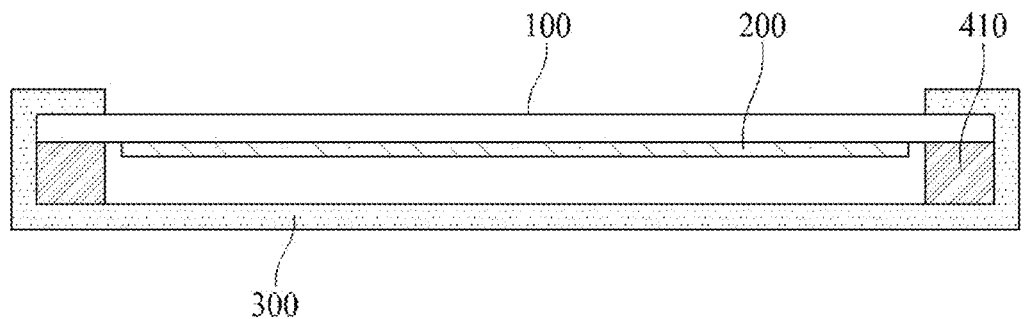
FIG. 2 is a cross-sectional view taken along line I-I' of FIG. 1.

FIG. 1 illustrates a display apparatus including a sound generating device according to an embodiment of the present disclosure. FIG. 2 is a cross-sectional view taken along line I-I' of FIG. 1.

With reference to FIG. 1, the display apparatus 10 may include a display panel 100, which displays an image, and a sound generating device 200 which is disposed on a rear surface of the display panel 100 and vibrates the display panel 100 to generate sound. For example, the sound generating device 200 may directly vibrate the display panel 100 to output sound toward a forward region in front of the display panel 100.

The display panel 100 may include a display area AA which displays an image and a non-display area which surrounds the display area AA. The non-display area may include a bending area BA. The bending area BA may be bent to form a curved surface.

The display panel 100 may display an image and may be implemented as any type of display panel, such as a liquid crystal display panel, an organic light emitting diode (OLED) display panel, an electroluminescent display panel, etc. The display panel 100 may vibrate based on a vibration of the sound generating device 200 to output a sound.

According to an embodiment, the display panel 100 may display an image in a type such as a top emission type, a bottom emission type, or a dual emission type, based on a structure of a pixel array layer including an anode electrode, a cathode electrode, and an organic compound layer. In the top emission type, visible light emitted from the pixel array layer may be irradiated onto a region in front of a base substrate to allow an image to be displayed. In the bottom emission type, the visible light emitted from the pixel array layer may be irradiated onto a rearward region behind the base substrate to allow an image to be displayed.

Moreover, the sound generating device 200 may generate a sound by using the display panel 100 as a vibration plate. The sound generating device 200 may be referred to as an "actuator," an "exciter," or a "transducer," but embodiments are not limited thereto. For example, the sound generating device 200 may be a sound device for outputting a sound according to an electrical signal.

FIG. 2 is a cross-sectional view taken along line I-I' of FIG. 1.

With reference to FIG. 2, the display apparatus 10 may include the sound generating device 200 and a supporting member 300.

The supporting member 300 may support one or more of a rear surface and a side surface of the display panel 100. Also, the sound generating device 200 may be fixed to the supporting member 300.

The supporting member 300 may be, for example, a cover bottom. For example, the supporting member 300 may include a middle cabinet which may be coupled or connected to a cover bottom to surround the side surface of the display panel 100 and accommodates one edge or periphery of the display panel 100 to support the display panel 100. For example, the middle cabinet may include a sideways-T(⊣)-shaped cross-sectional surface (or a T-shape having a 90-degree angle). The supporting member 300 may include the cover bottom, or may include the cover bottom and the middle cabinet, but embodiments are not limited thereto. For example, the supporting member 300 may include a structure that supports the rear surface or the side surface of the display panel 100.

Moreover, the supporting member 300 may be a plate member that may be provided on the rear surface of the display panel 100 or the whole display panel 100. For example, the supporting member 300 may cover the whole rear surface of the display panel 100 so as to be spaced apart from the rear surface. Also, the supporting member 300 may have a plate shape formed of a glass material, a metal material, or a plastic material. Here, an edge or a sharp corner of the supporting member 300 may have a tetragonal (e.g., quadrilateral) shape or a curved shape, e.g., through a chamfer process or a corner rounding process. According to an embodiment of the present disclosure, the supporting member 300 including the glass material may include sapphire glass. For example, the supporting member 300 including the metal material may include one or more of aluminum (Al), an Al alloy, a magnesium (Mg) alloy, and an iron (Fe)-nickel (Ni) alloy. As another example, the supporting member 300 may have a stacked structure including a glass plate and a metal plate, in which the metal plate may have a thickness relatively thinner than the glass plate and the glass plate may face the rear surface of the display panel 100. For example, a rear surface of the display apparatus 10 may be used as a mirror surface due to the metal plate.

Moreover, in the present disclosure, the supporting member 300 may be referred to as a "cover bottom," a "plate bottom," a "back cover," a "base frame," a "metal frame," a "metal chassis," a "chassis base," or an "m-chassis." Therefore, the supporting member 300 may be a supporter for supporting the display panel 100 and may be implemented as any type of frame or plate structure on the rear surface of the display apparatus.

An adhesive member 410 may be disposed in an edge or periphery of the display panel 100 and the supporting member 300. For example, the adhesive member 410 may be between the rear surface of the display panel 100 and an upper surface of the supporting member 300. The adhesive member 410 may attach the display panel 100 to the supporting member 300. Also, the adhesive member 410 may include a double-sided tape, a single-sided tape, an adhesive, a bond, and/or the like, but embodiments are not limited thereto.

Figure 3:
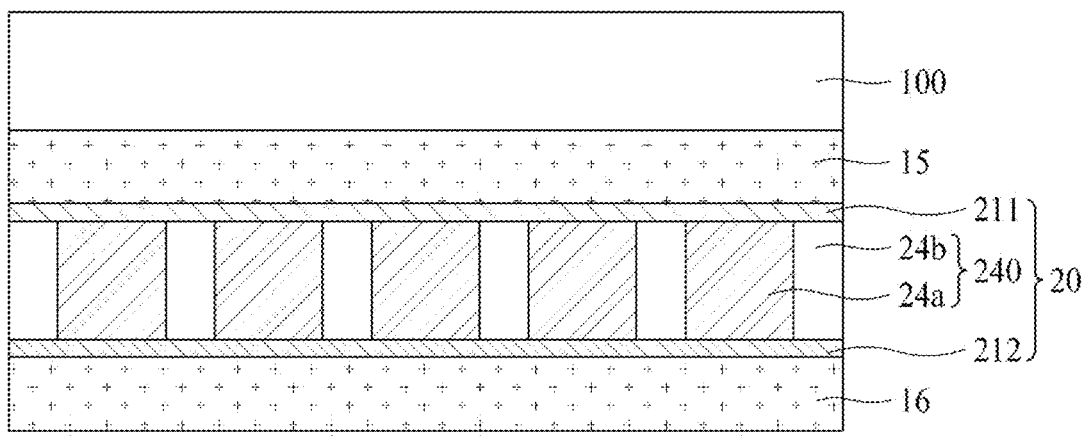
FIG. 3 illustrates a sound generating device according to an embodiment of the present disclosure.

FIG. 3 illustrates a display apparatus according to an embodiment of the present disclosure.

With reference to FIG. 3, the display apparatus 10 may include a display panel 100 and a sound generating device 20. The sound generating device 20 may include a first structure 240, a plurality of electrodes 211 and 212, and a plurality of passivation layers 15 and 16. The first structure 240 may include an inorganic material part 24a and an organic material part 24b.

When a sound generating device is disposed on a rear surface of a display panel, there is a problem where a thickness of a display apparatus is thickened as a thickness of the sound generating device is thickened. To solve the problem, a piezoelectric device having a thin thickness may be applied, but since the piezoelectric device is vulnerable to an external impact, the piezoelectric device is fragile, and due to this, has a problem where it is difficult to output a desired sound. Therefore, to apply a sound generating device to a display panel, an external impact should not be applied to the sound generating device. Therefore, the present inventors have performed an impact experiment after a sound generating device is applied to a display apparatus. This will be described below with reference to FIGS. 4A and 4B.

Figure 4A:
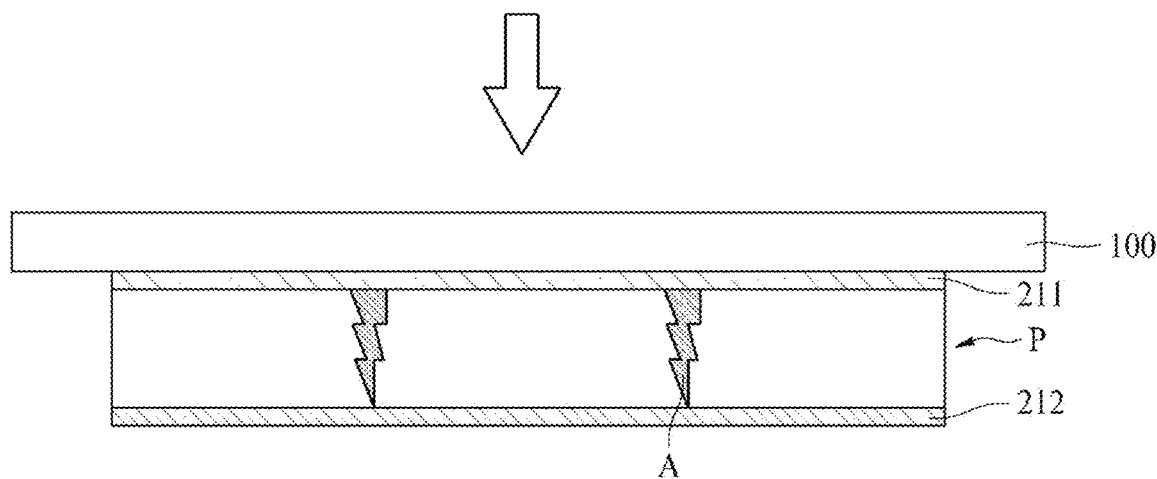
FIGS. 4A and 4B illustrate for describing an influence of an external impact on a sound generating device.
Figure 4B:
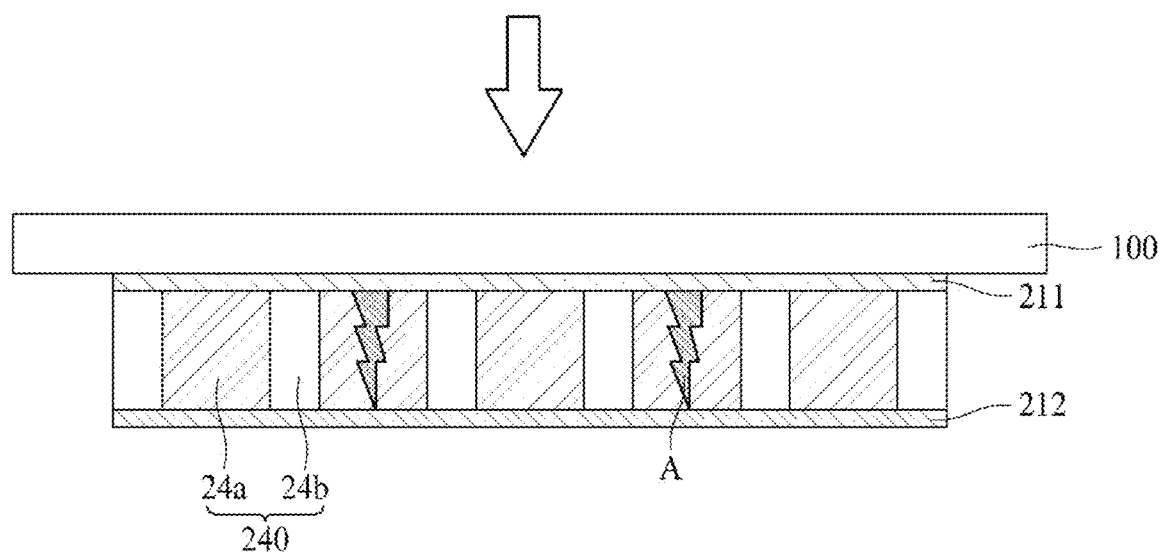

FIGS. 4A and 4B illustrate for describing an influence of an external impact on a sound generating device.

An external impact test performed on a display apparatus may use, for example, a ball drop test. The ball drop test may be a test where a sound generating module impacted and a display panel including the same are fixed to a drop position, and by allowing an iron bead having a weight of 100 g or 1,000 g to freely fall at a distance of 1 m in a vertical direction, the display performance of an impacted display panel after the ball drop test is compared with the display performance of an impacted display panel before the ball drop test. In a case which desires to check a quantitative control issue and a secondary collision issue in association with free fall with respect to a finished display apparatus to which a display panel and a sound generating module are applied, a free falling impact test with reliability added thereto may be used. The free falling impact test may be a test where, in a state where a finished display apparatus is applied, a falling target is transported by a certain height, for example 1 meter or more, and is freely fallen on a falling floor surface, and by using various sensors, a degree of damage of a freely fallen target is determined. However, embodiments are not limited thereto, and another method may be used as an impact test performed on a display panel and a sound generating module.

FIG. 4A illustrates a comparative example where a piezoelectric device is applied to a display apparatus. FIG. 4B illustrates an example where FIG. 3 is applied.

With reference to FIG. 4A, a plurality of electrodes 211 and 212 may be respectively disposed over and under piezoelectric ceramic which is a piezoelectric device P. The electrode 211 may be a positive (+) electrode, and the electrode 212 may be a negative (−) electrode. A young's modulus of the piezoelectric device P may be high, and due to this, when an external impact (illustrated by an arrow) is applied to the piezoelectric device P, the piezoelectric device P may be broken. A portion broken by an impact applied thereto is illustrated by "A". For example, the young's modulus of the piezoelectric device P may be 50 GPa or more. When an external impact is applied to a display apparatus, a screen of the display apparatus may be displayed, but since a piezoelectric device is broken, a sound may not be reproduced.

With reference to FIG. 4B, a plurality of electrodes 211 and 212 may be respectively disposed over and under a first structure 240 of a sound generating device. The electrode 211 may be a positive (+) electrode, and the electrode 212 may be a negative (−) electrode. For example, a young's modulus of the first structure 240 may be 50 GPa or less. The young's modulus of the first structure 240 may be less than a young's modulus of a piezoelectric device, the first structure 240 may have a characteristic robust to an impact. For example, an impact may be absorbed by an organic material part 24b included in the first structure 240, but an inorganic material part 24a may be partially broken (illustrated by "A"). Due to this, the performance or characteristic of the sound generating device may be reduced.

Therefore, the present inventors have implemented a sound generating device which vibrates a display panel to output a desired sound, decreases an impact applied thereto from the outside, and enhances a sound pressure level. This will be described below with reference to FIGS. 5 to 20.

Figure 5A:
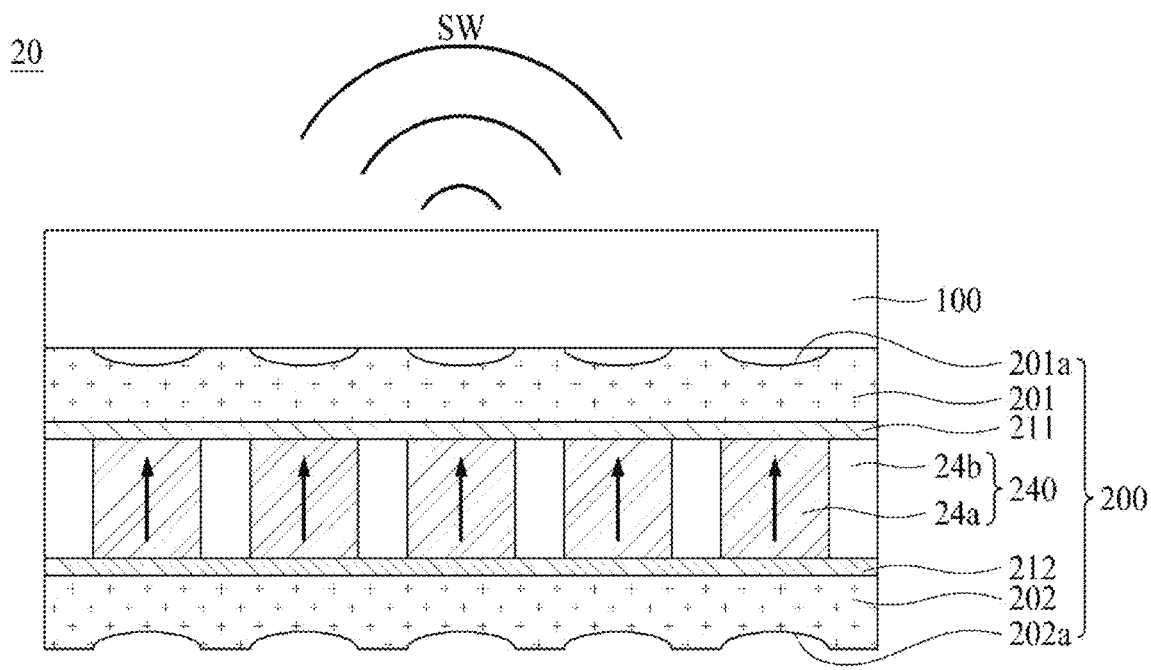
FIGS. 5A to 5C illustrate a display apparatus according to an embodiment of the present disclosure.
Figure 5B:
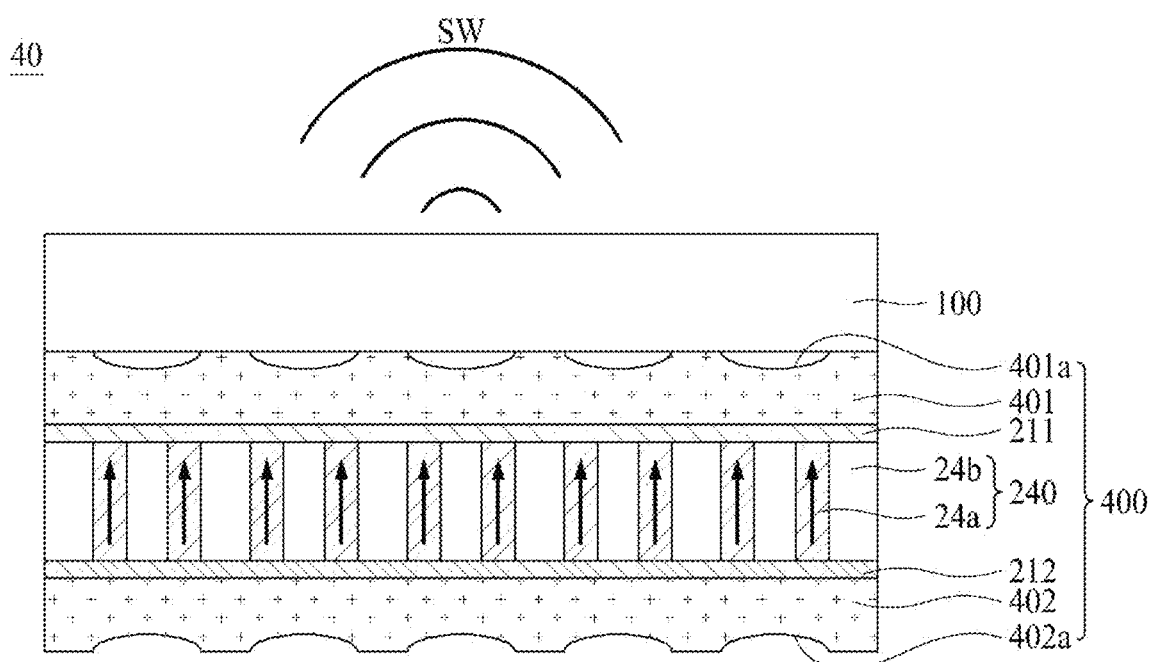
Figure 5C:
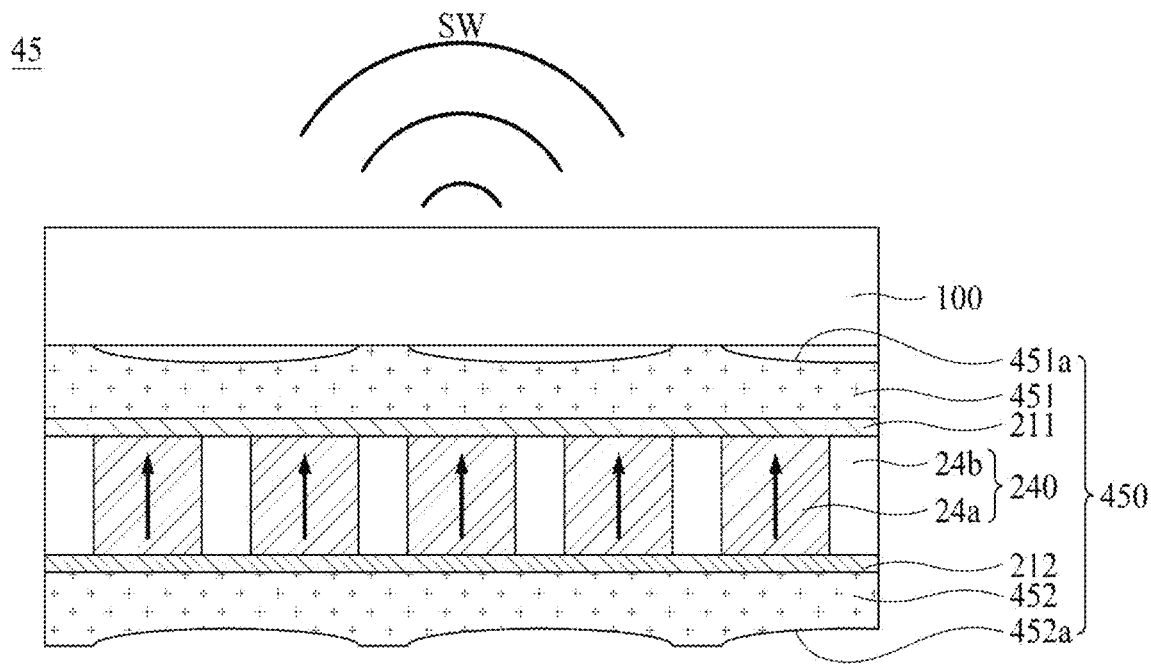

FIGS. 5A to 5C illustrates a display apparatus according to an embodiment of the present disclosure.

With reference to FIG. 5A, a display apparatus 20 according to an embodiment of the present disclosure may include a display panel 100 and a sound generating device 200. The sound generating device 200 may include a first structure 240, a plurality of electrodes 211 and 212, and a plurality of passivation layers 201 and 202. The first structure 240 may include a first part 24a and a second part 24b between adjacent first parts 24a. The first part 24a may include an inorganic material part, and the second part 24b may include an organic material part.

The first part 24a of the first structure 240 may have piezoelectric properties. Therefore, the inorganic material part may be formed of a ceramic-based electrically active material for realizing a high vibration. For example, the inorganic material part may be formed of a ceramic-based material for realizing a high vibration. As another example, the inorganic material part may be formed of piezoelectric ceramic having a perovskite crystalline structure. The perovskite crystalline structure may be a plate-shaped structure which has a piezoelectric effect, an inverse piezoelectric effect, and alignment properties. The perovskite crystalline structure may be represented by an $ABO_3$ chemical formula, wherein A includes a divalent metal element and B includes a tetravalent metal element. As another example, the inorganic material part may include one or more of lead (Pb), zirconium (Zr), titanium (Ti), zinc (Zn), nickel (Ni), and niobium (Nb), but embodiments are not limited thereto. As another example, the inorganic material part may include a PZT-based material including lead (Pb), zirconium (Zr), and titanium (Ti) and a PZNN-based material including lead (Pb), zinc (Zn), nickel (Ni), and niobium (Nb), but embodiments are not limited thereto. Also, the inorganic material part may include at least one of perovskite ($CaTiO_3$), barium titanate ($BaTiO_3$), and strontium titanate ($SrTiO_3$) including no Pb, but embodiments are not limited thereto. As another example, the inorganic material part may include piezoelectric ceramic having a wurtzite crystalline structure. For example, the inorganic material part may include at least one of aluminum nitride (AlN), silver iodide (AgI), zinc oxide (ZnO), cadmium sulfide (CdS), cadmium selenide (CdSe), silicon carbide ($\alpha$-SiC), gallium (III) nitride (GaN), and boron nitride (BN), but embodiments are not limited thereto.

The second part 24b may be configured to fill a space between adjacent first parts 24a. For example, the second part 24b may be formed of an organic material and may be disposed to fill a space between adjacent inorganic material parts which are first parts 24a. Alternatively, a plurality of first parts 24a and a plurality of second parts 24b may be alternately disposed. For example, an inorganic material part which is the first part 24a and an organic material part which is the second part 24b may be alternately disposed.

The second part 24b of the first structure 240 may have flexibility. The organic material part may include at least one of an organic piezoelectric material and an organic non-piezoelectric material. When the organic material part includes the organic piezoelectric material, the organic material part may be formed of a polymer having flexibility instead of ceramic, and thus, may absorb an impact applied to the inorganic material part and may release a stress concentrating on the inorganic material part, thereby enhancing the durability and impact resistance of the first structure 240 and providing a certain level of piezoelectric characteristic. The organic piezoelectric material may be a material having an electrically active characteristic. For example, the organic piezoelectric material may include at least one of PVDF, β-PVDF, and PVDF-TrFE, but embodiments are not limited thereto. The organic non-piezoelectric material may include at least one of an acrylic polymer, a silicon-based polymer, and an epoxy-based polymer, but embodiments are not limited thereto.

A ceramic plate including an inorganic material part which is the first part 24a may be formed and may be diced, and then, an organic material part which is the second part 24b may be filled into diced portions, thereby forming the first structure 240. A method of dicing the inorganic material part may use at least one of scribing, blade dicing, laser cutting, stealth dicing, and thermal laser separation (TLS), but embodiments are not limited thereto. As another example, the first structure 240 may be formed by filling the organic material part into the inorganic material part which is formed in a fiber form and aligned, but embodiments are not limited thereto.

A first electrode 211 may be disposed over the first structure 240, and a second electrode 212 may be disposed under the first structure 240. The first electrode 211 and the second electrode 212 may apply a voltage to the first structure 240. For example, the first electrode 211 may be a negative (−) electrode, and the second electrode 212 may be a positive (+) electrode. As another example, the first electrode 211 may be a positive (+) electrode, and the second electrode 212 may be a negative (−) electrode. For example, the first electrode 211 and the second electrode 212 may include one or more of carbon (C), palladium (Pd), iron (Fe), tin (Sn), aluminum (Al), nickel (Ni), platinum (Pt), gold (Au), silver (Ag), copper (Cu), titanium (Ti), and molybdenum (Mo), or an alloy thereof, but embodiments are not limited thereto. For example, the first electrode 211 and the second electrode 212 may include indium tin oxide (ITO) or a molybdenum-titanium alloy (a Mo—Ti alloy), but embodiments are not limited thereto.

When an alternating current (AC) voltage is applied to the first electrode 211 and the second electrode 212 of the sound generating device 200, the first structure 240 may alternately and repeatedly expand and contract, thereby generating a vibration based on a bending phenomenon where a bending direction is alternately changed. The display panel 100 may vibrate based on the generated vibration to generate a sound SW. For example, the sound generating device 200 may directly vibrate the display panel 100 to output the sound SW to a forward region in front of the display panel 100. The display panel 100 may vibrate with kinetic energy based on polarization which is performed in a direction vertical to the display panel 100. Therefore, polarization performed in a vector direction except the direction vertical to the display panel 100 may be lost. A whole vibration of the sound generating device 200 may be affected by summated energy in the vector direction vertical to the display panel 100, and thus, a polarization direction (illustrated by an arrow) of the first structure 240 may be a direction vertical to the display panel 100.

A first passivation layer 201 may be disposed over the first electrode 211, and a second passivation layer 202 may be disposed under the second electrode 212. The first passivation layer 201 and the second passivation layer 202 may be formed of polyimide, but are not limited thereto. When an external impact is applied, the first passivation layer 201 and the second passivation layer 202 may protect the first structure 240. For example, at least a portion of the first passivation layer 201 and the second passivation layer 202 may have a non-flat shape. The first passivation layer 201 and the second passivation layer 202 may be provided to have a shape corresponding to the first part 24a or the second part 24b. For example, as described with reference to FIG. 4B, when an external impact is applied, an impact applied to the first part 24a in the first structure 240 may be greater than an impact applied to the second part 24b, and thus, the first passivation layer 201 and the second passivation layer 202 may be provided to have a shape corresponding to the first part 24a. The first passivation layer 201 may include a plurality of concave portions 201a, and the plurality of concave portions 201a may be disposed to correspond to the first part 24a. The second passivation layer 202 may include a plurality of concave portions 202a, and the plurality of concave portions 202a may be disposed to correspond to the first part 24a. Since the first passivation layer 201 or the second passivation layer 202 includes the plurality of concave portions 201a or the plurality of concave portions 202a, air around the sound generating device 200 may vibrate to amplify a sound, and thus, a sound pressure level of the sound generating device 200 may be enhanced, thereby decreasing an impact applied to the sound generating device 200 when an external impact is applied. A degree of amplification of a sound may vary based on a shape of the first passivation layer 201 and the second passivation layer 202, and for example, a shape of the first passivation layer 201 and the second passivation layer 202 may be a triangular (e.g., quadrilateral) shape, a tetragonal shape, a spherical shape, a circular shape, an oval (e.g., elliptical) shape, or the like. However, the shape is not limited thereto. When the first passivation layer 201 and the second passivation layer 202 has an oval shape, a sound may be more amplified. The first passivation layer 201 and the second passivation layer 202 may be implemented to have an embossing shape including a plurality of concave portions using an embossing roller, but embodiments are not limited thereto.

With reference to FIG. 5B, a display apparatus 40 according to an embodiment of the present disclosure may include a display panel 100 and a sound generating device 400. In comparison with FIG. 5A, in the sound generating device 400, a first part and a second part may be widely provided in the same area, and thus, a sound characteristic and flexibility may be further enhanced. The sound generating device 400 may include a first structure 240, a plurality of electrodes 211 and 212, and a plurality of passivation layers (for example, first and second passivation layers) 401 and 402. The first passivation layer 401 may be disposed over the first electrode 211, and the second passivation layer 402 may be disposed under the second electrode 212. The first passivation layer 401 and the second passivation layer 402 may be formed of polyimide, but embodiments are not limited thereto. When an external impact is applied, the first passivation layer 401 and the second passivation layer 402 may protect the first structure 240. For example, at least a portion of the first passivation layer 401 and the second passivation layer 402 may have a non-flat shape. The first passivation layer 401 and the second passivation layer 402 may have a shape corresponding to a first part 24a or a second part 24b. For example, as described with reference to FIG. 4B, when an external impact is applied, an impact applied to the first part 24a included in the first structure 240 may be greater than an impact applied to the second part 24b, and thus, the first passivation layer 401 and the second passivation layer 402 may have a shape corresponding to the first part 24a. The first passivation layer 401 may include a plurality of concave portions 401a, and the plurality of concave portions 401a may correspond to at least two first parts 24a and a second part 24b. For example, the plurality of concave portions 401a may correspond to at least two first parts 24a and a second part 24b between the at least two first parts 24a. The second passivation layer 402 may include a plurality of concave portions 402a, and the plurality of concave portions 402a may correspond to at least two first parts 24a and a second part 24b. For example, the plurality of concave portions 402a may correspond to at least two first parts 24a and a second part 24b between the at least two first parts 24a. Since the first passivation layer 401 or the second passivation layer 402 may include a plurality of concave portions, air around the sound generating device 400 may vibrate to amplify a sound, and thus, a sound pressure level of the sound generating device 400 may be enhanced, thereby decreasing an impact applied to the sound generating device 400 when an external impact is applied. A degree of amplification of a sound may vary based on a shape of the first passivation layer 401 and the second passivation layer 402, and for example, a shape of the first passivation layer 401 and the second passivation layer 402 may be a triangular shape, a tetragonal (e.g., quadrilateral) shape, a spherical shape, a circular shape, an oval (e.g., elliptical) shape, or the like. However, the shape is not limited thereto. When the first passivation layer 401 and the second passivation layer 402 has an oval (e.g., elliptical) shape, a sound may be more amplified. The first passivation layer 401 and the second passivation layer 402 may be implemented to have an embossing shape including a plurality of concave portions using an embossing roller, but embodiments are not limited thereto.

With reference to FIG. 5C, a display apparatus 45 according to an embodiment of the present disclosure may include a display panel 100 and a sound generating device 450. The sound generating device 450 may include a first structure 240, a plurality of electrodes 211 and 212, and a plurality of passivation layers (for example, first and second passivation layers) 451 and 452. The first passivation layer 451 may be disposed over the first electrode 211, and the second passivation layer 452 may be disposed under the second electrode 212. The first passivation layer 451 and the second passivation layer 452 may be formed of polyimide, but embodiments are not limited thereto. When an external impact is applied, the first passivation layer 451 and the second passivation layer 452 may protect the first structure 240. For example, at least a portion of the first passivation layer 451 and the second passivation layer 452 may have a non-flat shape. The first passivation layer 451 and the second passivation layer 452 may have a shape corresponding to a first part 24a or a second part 24b. For example, as described with reference to FIG. 4B, when an external impact is applied, an impact applied to the first part 24a in the first structure 240 may be greater than an impact applied to the second part 24b, and thus, the first passivation layer 451 and the second passivation layer 452 may have a shape corresponding to the first part 24a. The first passivation layer 451 may include a plurality of concave portions 451a, and the plurality of concave portions 451a may be disposed to correspond to at least two first parts 24a and a second part 24b. For example, the plurality of concave portions 451a may be disposed to correspond to at least two first parts 24a and a second part 24b between the at least two first parts 24a. The second passivation layer 452 may include a plurality of concave portions 452a, and the plurality of concave portions 452a may be disposed to correspond to at least two first parts 24a and a second part 24b. For example, the plurality of concave portions 452a may be disposed to correspond to at least two first parts 24a and a second part 24b between the at least two first parts 24a. In a case where the plurality of concave portions of the first passivation layer 451 or the second passivation layer 452 are provided to correspond to the at least two first parts 24a and the second part 24b, the first passivation layer 451 including the plurality of concave portions 451a and the second passivation layer 452 including the plurality of concave portions 452a may be easily manufactured. Since the first passivation layer 451 or the second passivation layer 452 may include a plurality of concave portions, air around the sound generating device 450 may vibrate to amplify a sound, and thus, a sound pressure level of the sound generating device 450 may be enhanced, thereby decreasing an impact applied to the sound generating device 450 when an external impact is applied. A degree of amplification of a sound may vary based on a shape of the first passivation layer 451 and the second passivation layer 452, and for example, a shape of the first passivation layer 451 and the second passivation layer 452 may be a triangular shape, a tetragonal (e.g., quadrilateral) shape, a spherical shape, a circular shape, an oval (e.g., elliptical) shape, or the like. However, the shape is not limited thereto. The first passivation layer 451 and the second passivation layer 452 may be implemented to have an embossing shape including a plurality of concave portions using an embossing roller, but embodiments are not limited thereto.

With reference to FIGS. 5A to 5C, an adhesive member may be further provided between the first passivation layer 201, 401 and 451 and the first electrode 211, and an adhesive member may be further provided between the second passivation layer 202, 402 and 452 and the second electrode 212. The adhesive may be, for example, an acrylic adhesive, an epoxy-based adhesive, and a silicon-based adhesive, and a functional group may be added to the adhesive to improve an adhesive force or a manufacturing process. However, embodiments are not limited thereto. Also, to improve an adhesive force to the passivation layer 201, 202, 401, 402, 451, and 452 and/or enhance an elastic modulus suitable for the first electrode 211 or the second electrode 212, the adhesive may be used in common or mixed, or a thickness of the adhesive may be differently adjusted. However, embodiments are not limited thereto.

Figure 6A:
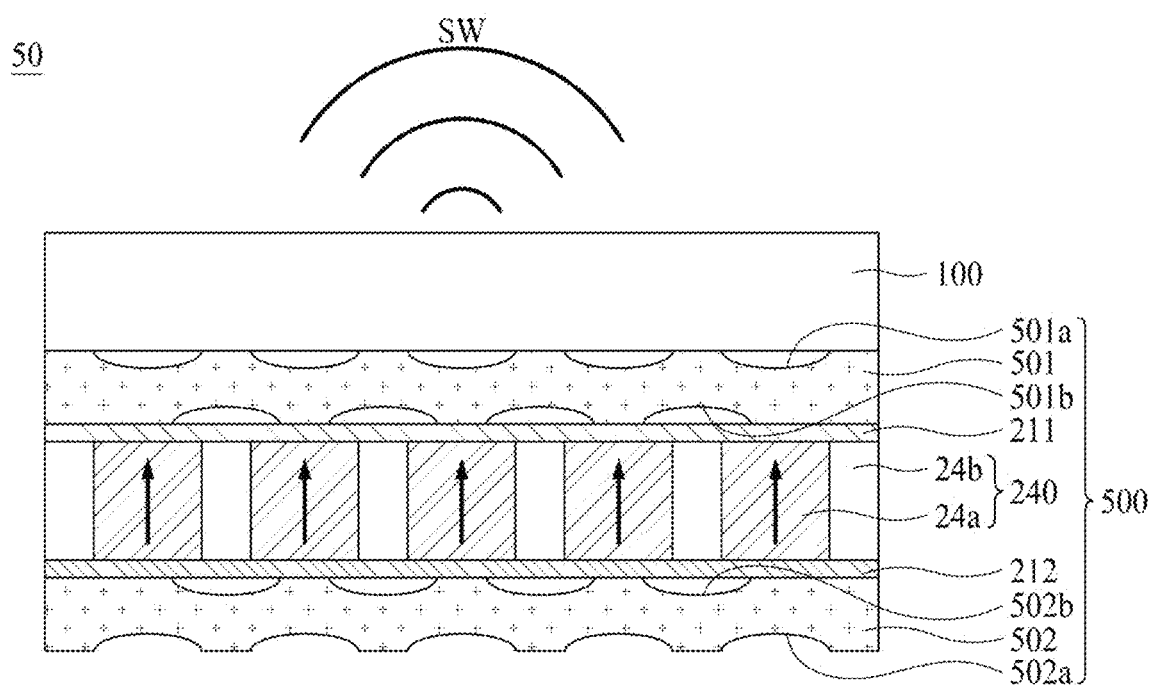
FIGS. 6A to 6C illustrate a display apparatus according to an embodiment of the present disclosure.
Figure 6B:
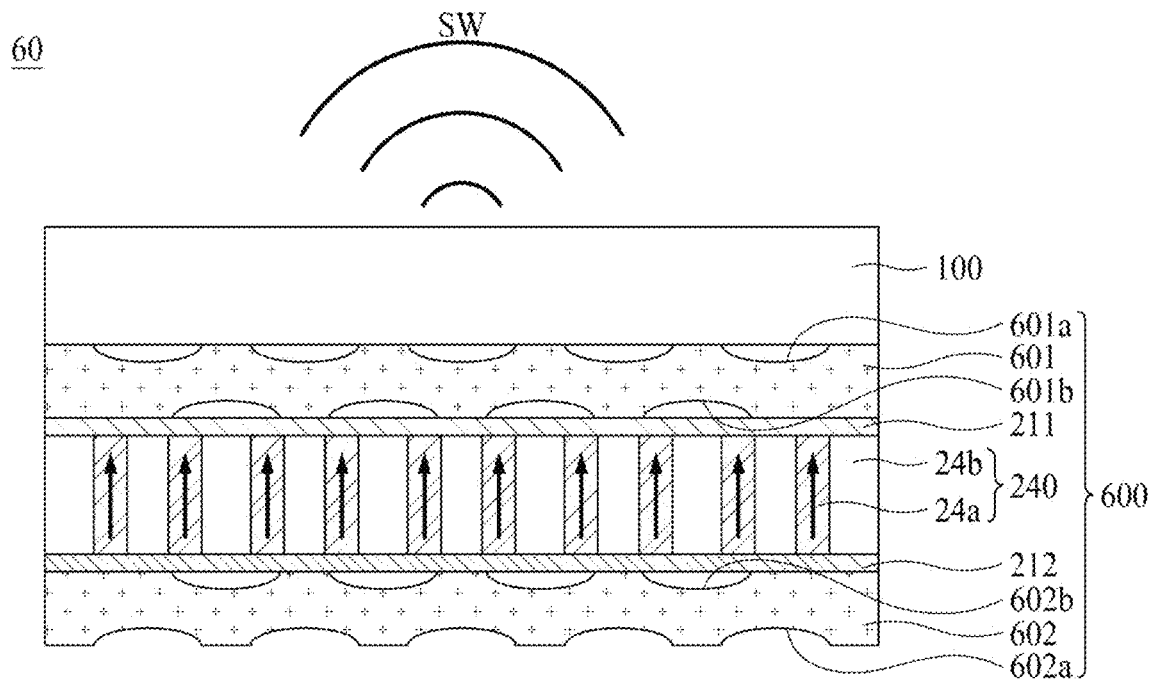
Figure 6C:
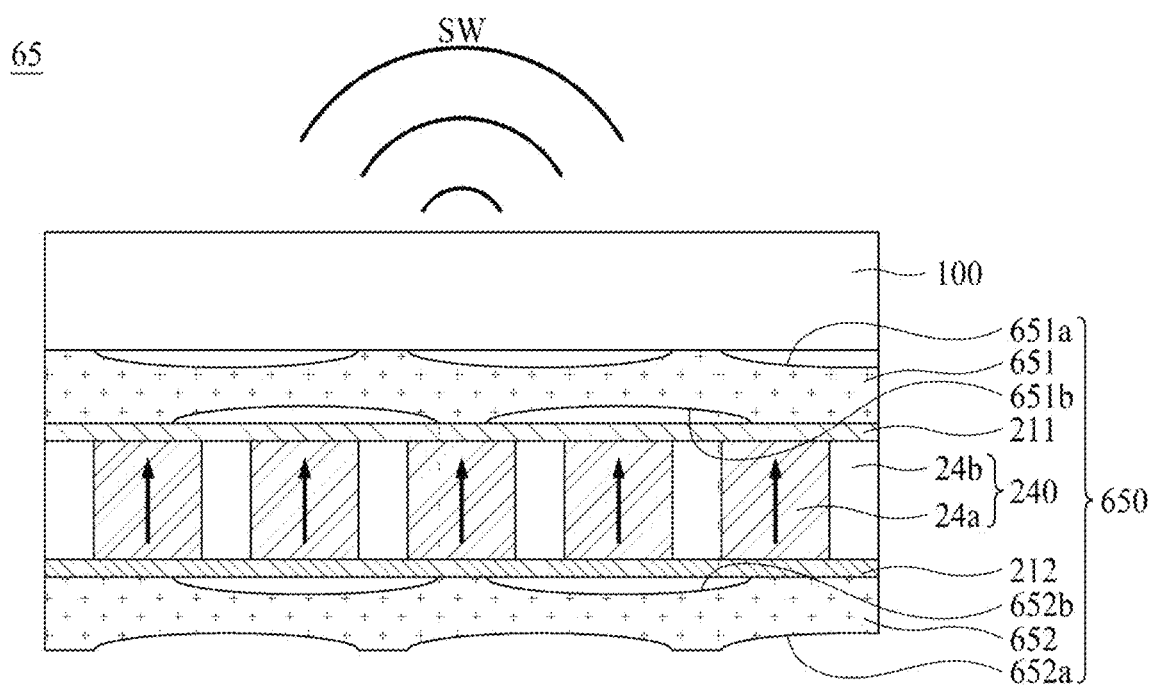

FIGS. 6A to 6C illustrate a display apparatus according to an embodiment of the present disclosure.

With reference to FIG. 6A, a display apparatus 50 according to an embodiment of the present disclosure may include a display panel 100 and a sound generating device 500. The sound generating device 500 may include a first structure 240, a plurality of electrodes 211 and 212, and a plurality of passivation layers (for example, first and second passivation layers) 501 and 502. The first structure 240 and the electrodes 211 and 212 are as described above with reference to FIGS. 5A to 5C, and thus, their detailed descriptions are omitted. The first passivation layer 501 may be disposed over the first electrode 211, and the second passivation layer 502 may be disposed under the second electrode 212. The first passivation layer 501 and the second passivation layer 502 may be formed of polyimide, but are not limited thereto. When an external impact is applied, the first passivation layer 501 and the second passivation layer 502 may protect the first structure 240. For example, at least a portion of the first passivation layer 501 and the second passivation layer 502 may have a non-flat shape. For example, as described with reference to FIG. 4B, when an external impact is applied, an impact applied to the first part 24a included in the first structure 240 may be greater than an impact applied to the second part 24b, and thus, the first passivation layer 501 and the second passivation layer 502 may be provided to have a shape corresponding to the first part 24a. For example, the first passivation layer 501 may include a plurality of concave portions 501a and a plurality of convex portions 501b. The second passivation layer 502 may include a plurality of concave portions 502a and a plurality of convex portions 502b. The plurality of concave portions and the plurality of convex portions of the first passivation layer 501 and the second passivation layer 502 may be arranged in zigzag. For example, the plurality of concave portions 501a of the first passivation layer 501 may be disposed to correspond to the first part 24a, and the plurality of convex portions 501b may be disposed to correspond to the first part 24a and the second portion 24b. For example, the plurality of concave portions 502a of the second passivation layer 502 may be disposed to correspond to the first part 24a, and the plurality of convex portions 502b may be disposed to correspond to the first part 24a and the second portion 24b. An air layer of the plurality of convex portions 501b and 502b may prevent the first part 24a from being damaged by an external impact or an external pressure and when a voltage is applied to the electrode, may secure a space enabling the first part 24a to vibrate, thereby enhancing a sound pressure level. Since the first passivation layer 501 or the second passivation layer 502 includes the plurality of concave portions or the plurality of convex portions, air around the sound generating device 500 may vibrate and may secure a vibration space, and thus, may amplify a sound to enhance a sound pressure level of the sound generating device 500, thereby decreasing an impact applied to the sound generating device 600 when an external impact is applied. A degree of amplification of a sound may vary based on a shape of the first passivation layer 501 and the second passivation layer 502, and for example, a shape of the first passivation layer 501 and the second passivation layer 502 may be a triangular shape, a tetragonal (e.g., quadrilateral) shape, a spherical shape, a circular shape, an oval (e.g., elliptical) shape, or the like. However, the shape is not limited thereto. The first passivation layer 501 and the second passivation layer 502 may be implemented to have an embossing shape including a plurality of concave portions and a plurality of convex portions by using an embossing roller, but embodiments are not limited thereto.

In FIG. 6A, the plurality of concave portions and the plurality of convex portions of the first passivation layer 501 and the second passivation layer 502 may be asymmetrically disposed. For example, the plurality of concave portions 501a of the first passivation layer 501 may correspond to the plurality of convex portions 502b of the second passivation layer 502, and the plurality of convex portions 501b of the first passivation layer 501 may correspond to the plurality of concave portions 502a of the second passivation layer 502. As another example, the plurality of concave portions and the plurality of convex portions of the first passivation layer 501 and the second passivation layer 502 may be symmetrically disposed. For example, the plurality of concave portions 501a of the first passivation layer 501 may correspond to the plurality of concave portions 502a of the second passivation layer 502, and the plurality of convex portions 501b of the first passivation layer 501 may correspond to the plurality of convex portions 502b of the second passivation layer 502.

With reference to FIG. 6B, a display apparatus 60 according to an embodiment of the present disclosure may include a display panel 100 and a sound generating device 600. The sound generating device 600 may include a first structure 240, a plurality of electrodes 211 and 212, and a plurality of passivation layers (for example, first and second passivation layers) 601 and 602. Comparing with FIG. 6A, in the sound generating device 600, a first part and a second part may be widely provided in the same area, and thus, a sound characteristic and flexibility may be more enhanced. The first structure 240 and the electrodes 211 and 212 are as described above with reference to FIGS. 5A to 5C, and thus, their detailed descriptions may be omitted. The first passivation layer 601 may be disposed over the first electrode 211, and the second passivation layer 602 may be disposed under the second electrode 212. The first passivation layer 601 and the second passivation layer 602 may be formed of polyimide, but embodiments are not limited thereto. When an external impact is applied, the first passivation layer 601 and the second passivation layer 602 may protect the first structure 240. For example, at least a portion of the first passivation layer 601 and the second passivation layer 602 may have a non-flat shape. For example, as described with reference to FIG. 4B, when an external impact is applied, an impact applied to the first part 24a in the first structure 240 may be greater than an impact applied to the second part 24b, and thus, the first passivation layer 601 and the second passivation layer 602 may have a shape corresponding to the first part 24a. For example, the first passivation layer 601 may include a plurality of concave portions 601a and a plurality of convex portions 601b. The second passivation layer 602 may include a plurality of concave portions 602a and a plurality of convex portions 602b. The plurality of concave portions and the plurality of convex portions of the first passivation layer 601 and the second passivation layer 602 may be arranged in zigzag. The plurality of concave portions 601a of the first passivation layer 601 may be disposed to correspond to at least two first parts 24a and a second part 24b. For example, the plurality of concave portions 601a may be disposed to correspond to at least two first parts 24a and the second part 24b between the at least two first parts 24a. The plurality of convex portions 601b of the first passivation layer 601 may be disposed to correspond to at least two first parts 24a and a second part 24b. For example, the plurality of convex portions 601b may be disposed to correspond to at least two first parts 24a and the second part 24b disposed between the at least two first parts 24a. The plurality of concave portions 602a of the second passivation layer 602 may be disposed to correspond to at least two first parts 24a and a second part 24b. For example, the plurality of concave portions 602a may be disposed to correspond to at least two first parts 24a and the second part 24b disposed between the at least two first parts 24a. The plurality of convex portions 602b of the second passivation layer 602 may be disposed to correspond to at least two first parts 24a and a second part 24b. For example, the plurality of convex portions 602b may be disposed to correspond to at least two first parts 24a and the second part 24b disposed between the at least two first parts 24a. An air layer of the plurality of convex portions 601b and 602b may prevent the first part 24a from being damaged by an external impact or an external pressure and when a voltage is applied to the electrode, may secure a space enabling the first part 24a to vibrate, thereby enhancing a sound pressure level. Since the first passivation layer 601 or the second passivation layer 602 includes the plurality of concave portions or the plurality of convex portions, air around the sound generating device 600 may vibrate and may secure a vibration space, and thus, may amplify a sound to enhance a sound pressure level of the sound generating device 600, thereby decreasing an impact applied to the sound generating device 600 when an external impact is applied. A degree of amplification of a sound may vary based on a shape of the first passivation layer 601 and the second passivation layer 602, and for example, a shape of the first passivation layer 601 and the second passivation layer 602 may be a triangular shape, a tetragonal shape, a spherical shape, a circular shape, an oval shape, or the like. However, the shape is not limited thereto. The first passivation layer 601 and the second passivation layer 602 may be implemented to have an embossing shape including a plurality of concave portions and a plurality of convex portions by using an embossing roller, but embodiments are not limited thereto.

In FIG. 6B, the plurality of concave portions and the plurality of convex portions of the first passivation layer 601 and the second passivation layer 602 may be asymmetrically disposed. For example, the plurality of concave portions 601a of the first passivation layer 601 may correspond to the plurality of convex portions 602b of the second passivation layer 602, and the plurality of convex portions 601b of the first passivation layer 601 may correspond to the plurality of concave portions 602a of the second passivation layer 602. As another example, the plurality of concave portions and the plurality of convex portions of the first passivation layer 601 and the second passivation layer 602 may be symmetrically disposed. For example, the plurality of concave portions 601a of the first passivation layer 601 may correspond to the plurality of concave portions 602a of the second passivation layer 602, and the plurality of convex portions 601b of the first passivation layer 601 may correspond to the plurality of convex portions 602b of the second passivation layer 602.

With reference to FIG. 6C, a display apparatus 65 according to an embodiment of the present disclosure may include a display panel 100 and a sound generating device 650. The sound generating device 650 may include a first structure 240, a plurality of electrodes 211 and 212, and a plurality of passivation layers (for example, first and second passivation layers) 651 and 652. The first structure 240 and the electrodes 211 and 212 are as described above with reference to FIGS. 5A to 5C, and thus, their detailed descriptions are omitted. The first passivation layer 651 may be disposed over the first electrode 211, and the second passivation layer 652 may be disposed under the second electrode 212. The first passivation layer 651 and the second passivation layer 652 may be formed of polyimide, but are not limited thereto. When an external impact is applied, the first passivation layer 651 and the second passivation layer 652 may protect the first structure 240. For example, at least a portion of the first passivation layer 651 and the second passivation layer 652 may have a non-flat shape. For example, as described with reference to FIG. 4B, when an external impact is applied, an impact applied to the first part 24a included in the first structure 240 may be greater than an impact applied to the second part 24b, and thus, the first passivation layer 651 and the second passivation layer 652 may be provided to have a shape corresponding to the first part 24a. For example, the first passivation layer 651 may include a plurality of concave portions 651a and a plurality of convex portions 651b. The second passivation layer 652 may include a plurality of concave portions 652a and a plurality of convex portions 652b. The plurality of concave portions and the plurality of convex portions of the first passivation layer 651 and the second passivation layer 652 may be arranged in zigzag. The plurality of concave portions 651a of the first passivation layer 651 may be disposed to correspond to at least two first parts 24a and a second part 24b. For example, the plurality of concave portions 651a may be disposed to correspond to at least two first parts 24a and a second part 24b disposed between the at least two first parts 24a. The plurality of convex portions 651b of the first passivation layer 651 may be disposed to correspond to at least three first parts 24a and at least two second parts 24b. For example, the plurality of convex portions 651b may be disposed to correspond to at least three first parts 24a and at least two seconds part 24b disposed between the at least three first parts 24a. The plurality of convex portions 652b of the second passivation layer 652 may be disposed to correspond to at least three first parts 24a and at least two second parts 24b. For example, the plurality of convex portions 652b may be disposed to correspond to at least three first parts 24a and at least two second parts 24b disposed between the at least three first parts 24a. The plurality of concave portions 652a of the second passivation layer 652 may be disposed to correspond to at least two first parts 24a and a second part 24b. For example, the plurality of concave portions 652a may be disposed to correspond to at least two first parts 24a and the second part 24b disposed between the at least two first parts 24a. In this case, the first passivation layer 651 including the plurality of concave portions 651a and the plurality of convex portions 651b and the second passivation layer 652 including the plurality of concave portions 652a and the plurality of convex portions 652b may be easily manufactured. An air layer of the plurality of convex portions 651b and 652b may prevent the first part 24a from being damaged by an external impact or an external pressure and when a voltage is applied thereto, may secure a space enabling the first part 24a to vibrate, thereby enhancing a sound pressure level. Since the first passivation layer 651 or the second passivation layer 652 includes the plurality of concave portions or the plurality of convex portions, air around the sound generating device 650 may vibrate and may secure a vibration space, and thus, may amplify a sound to enhance a sound pressure level of the sound generating device 650, thereby decreasing an impact applied to the sound generating device 650 when an external impact is applied. A degree of amplification of a sound may vary based on a shape of the first passivation layer 651 and the second passivation layer 652, and for example, a shape of the first passivation layer 651 and the second passivation layer 652 may be a triangular shape, a tetragonal shape, a spherical shape, a circular shape, an oval shape, or the like. However, the shape is not limited thereto. The first passivation layer 651 and the second passivation layer 652 may be implemented to have an embossing shape including a plurality of concave portions and a plurality of convex portions using an embossing roller, but embodiments are not limited thereto.

In FIG. 6C, the plurality of concave portions and the plurality of convex portions of the first passivation layer 651 and the second passivation layer 652 may be asymmetrically disposed. For example, the plurality of concave portions 651a of the first passivation layer 651 may correspond to the plurality of convex portions 652b of the second passivation layer 652, and the plurality of convex portions 651b of the first passivation layer 651 may correspond to the plurality of concave portions 652a of the second passivation layer 652. As another example, the plurality of concave portions and the plurality of convex portions of the first passivation layer 651 and the second passivation layer 652 may be symmetrically disposed. For example, the plurality of concave portions 651a of the first passivation layer 651 may correspond to the plurality of concave portions 652a of the second passivation layer 652, and the plurality of convex portions 651b of the first passivation layer 651 may correspond to the plurality of convex portions 652b of the second passivation layer 652.

With reference to FIGS. 6A to 6C, an adhesive member may be further provided between the first passivation layer 501, 601 and 651 and the first electrode 211, and an adhesive member may be further provided between the second passivation layer 502, 602 and 652 and the first electrode 212. The adhesive may be, for example, an acrylic adhesive, an epoxy-based adhesive, and a silicon-based adhesive, and a functional group may be added to the adhesive to improve an adhesive force or a manufacturing process. However, embodiments are not limited thereto. Also, in order to improve an adhesive force to the passivation layer 501, 502, 601, 602, 651, and 652 and/or enhance an elastic modulus suitable for the first electrode 211 or the second electrode 212, the adhesive may be used in common or mixed, or a thickness of the adhesive may be differently adjusted. However, embodiments are not limited thereto.

Figure 7:
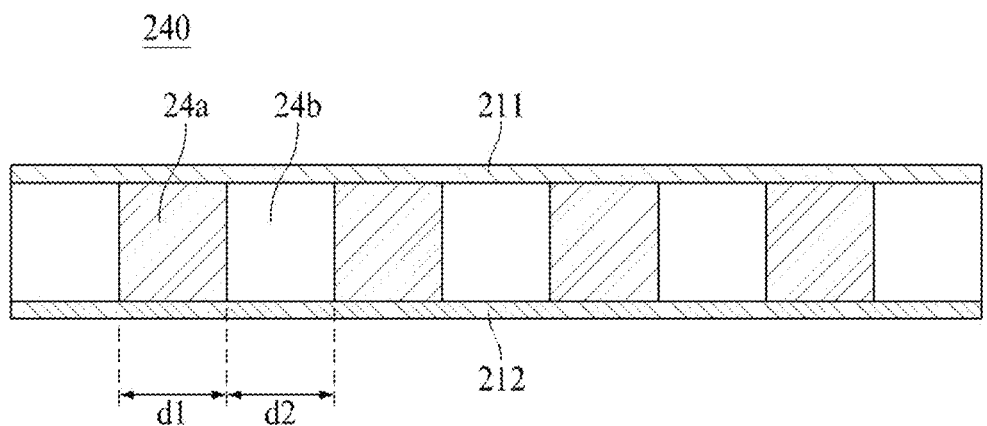
FIG. 7 illustrates an example of a first structure of a sound generating device according to an embodiment of the present disclosure.

FIG. 7 illustrates an example of a first structure of a sound generating device according to an embodiment of the present disclosure.

With reference to FIG. 7, a first structure 240 of a sound generating device may include a first part 24*a* and a second part 24*b*. The first structure 240 may include the first part 24*a* and the second part 24*b* disposed between adjacent first parts 24*a*. The first part 24*a* may include an inorganic material part, and the second part 24*b* may include an organic material part. The first part 24*a* and the second part 24*b* may be disposed in parallel on the same plane. The second part 24*b* may be configured to fill a space between adjacent first parts 24*a*. For example, the second part 24*b* may be formed of an organic material part and may be disposed to fill a space between adjacent inorganic material parts which are first parts 24*a*. Alternatively, a plurality of first parts 24*a* and a plurality of second parts 24*b* may be alternately disposed. For example, an inorganic material part which is the first part 24*a* and an organic material part which is the second part 24*b* may be alternately disposed.

The first structure 240 of the sound generating device may include a plurality of diagonal patterns. The plurality of diagonal patterns may be a plurality of line patterns having a certain width d1, and one of the plurality of line patterns may have a distance of certain width d2 with respect to another pattern which is adjacent thereto and spaced apart therefrom. An organic material part configuring the second part 24*b* may be disposed between the plurality of line patterns to have the width d2 of an inorganic material part configuring the first part 24*a*. The plurality of line patterns may be at least one of various patterns such as a line pattern, a tetragonal pattern, a pentagonal pattern, and a honeycomb pattern, but embodiments are not limited thereto. Also, a plurality of circular patterns may have a circular shape, an oval shape, or a donut shape. The inorganic material part configuring the first part 24*a* may include a plurality of diagonal patterns or a plurality of circular patterns disposed apart from one another, and the organic material part configuring the second part 24*b* may be disposed to fill a space between adjacent inorganic material parts configuring the first part 24*a*.

Figure 8A:
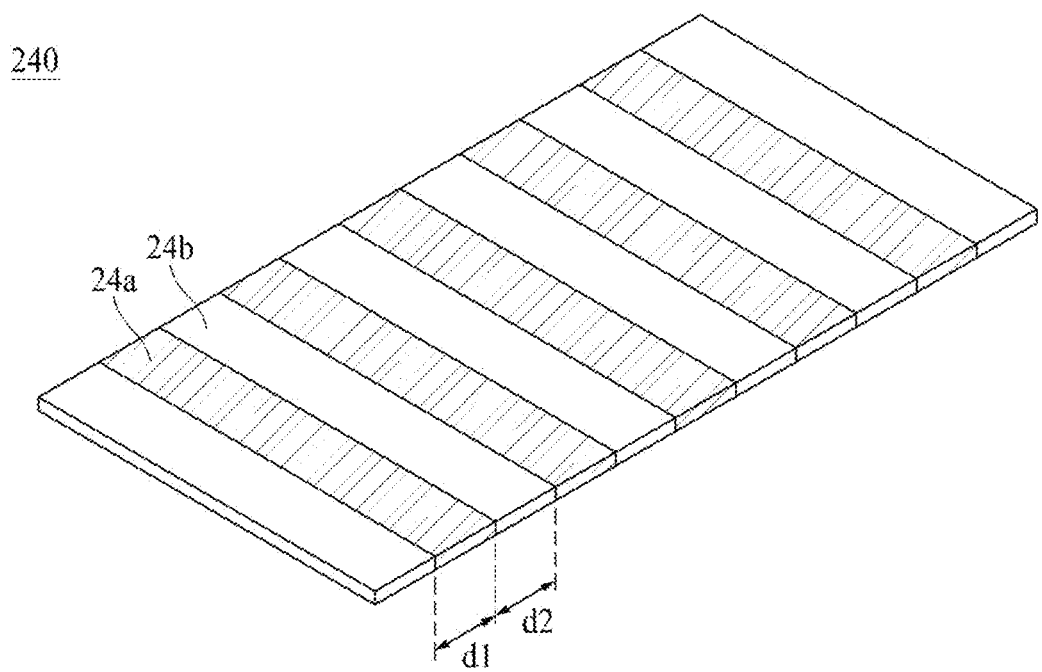
FIGS. 8A to 8C illustrate another example of a first structure of a sound generating device according to an embodiment of the present disclosure.
Figure 8B:
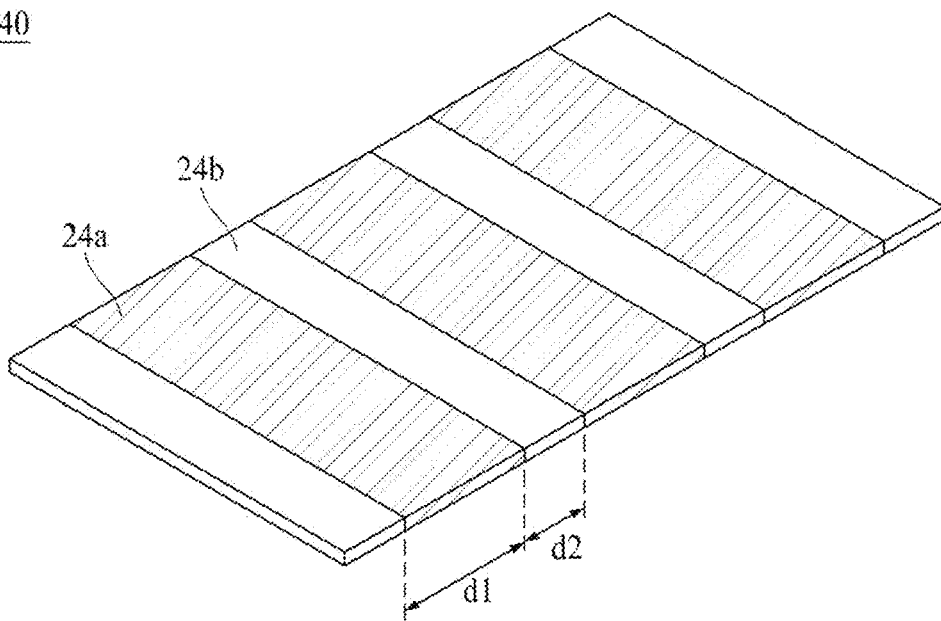
Figure 8C:
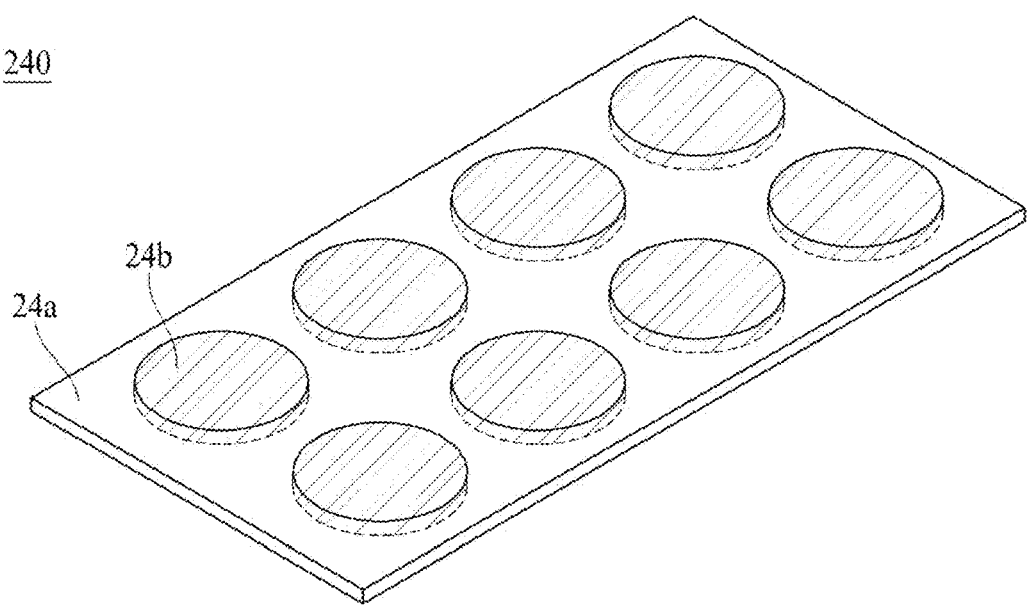

FIGS. 8A to 8C illustrate another example of a first structure of a sound generating device according to an embodiment of the present disclosure.

With reference to FIG. 8A, an inorganic material part of a width d1 and an organic material part of a width d2 of a sound generating device according to an embodiment of the present disclosure may be formed in a line pattern having the same width and may be alternately disposed.

With reference to FIG. 8B, an inorganic material part of a width d1 and of an organic material part of a width d2 of a sound generating device according to an embodiment of the present disclosure may be formed in a line pattern having different widths and may be alternately disposed. For example, a size of a first part 24*a* may be the same as or different from that of a second part 24*b*. When a width of the inorganic material part is greater than that of the organic material part, flexibility of the sound generating device may be reduced, but the sound generating device may have a high sound characteristic. Therefore, when a high sound characteristic is needed, a ratio of the inorganic material part may be set to be higher than that of the organic material part. As another example, when the width of the inorganic material part is less than that of the organic material part, flexibility of the sound generating device may be good. Accordingly, when flexibility is needed, a ratio of the organic material part may be set to be higher than that of the inorganic material part. In this case, for example, the sound generating device may be applied to a flexible display apparatus having a curve or a high curvature.

With reference to FIG. 8C, an inorganic material part may be formed in a plurality of circular or oval patterns, and an organic material part may be disposed between one inorganic material part formed in a circular or oval pattern and another inorganic material part which is adjacent thereto and is formed in a circular or oval pattern. A display apparatus including a sound generating device having a structure illustrated in FIG. 8C may be adjusted in order for a display panel to have various shapes. Also, a plurality of circular, oval, or donut patterns may be a fine pattern capable of corresponding to various shapes, and in a case which forms a circular, oval, or donut pattern, the pattern may be modified to correspond to various deformations of a display panel. Accordingly, a display apparatus may be implemented to have various shapes, and thus, a degree of freedom in design of a sound generating device based on a shape of the display apparatus may be enhanced and the sound generating device may be applied to a flexible display apparatus.

Figure 9A:
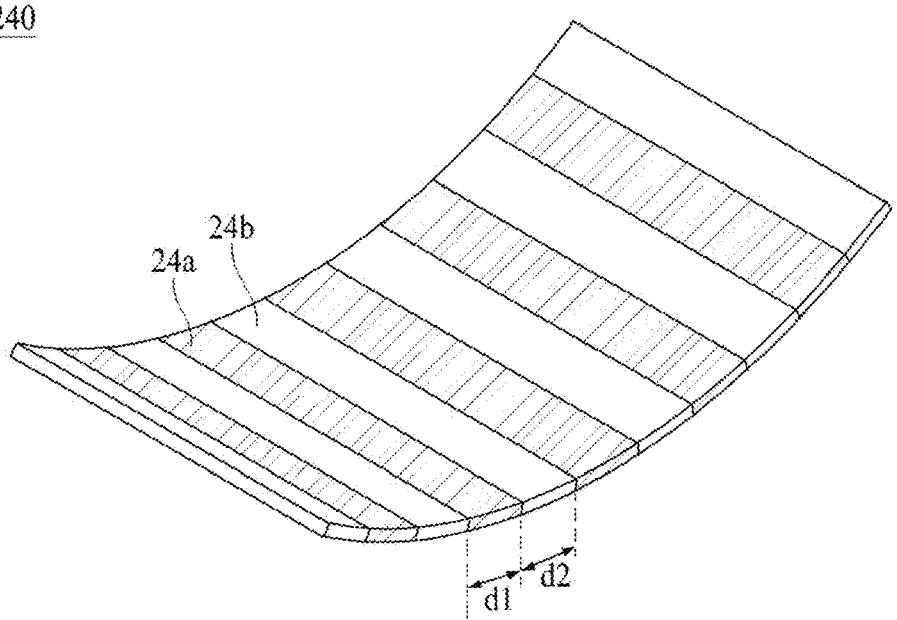
FIGS. 9A and 9B illustrate another example of a first structure of a sound generating device according to an embodiment of the present disclosure.
Figure 9B:
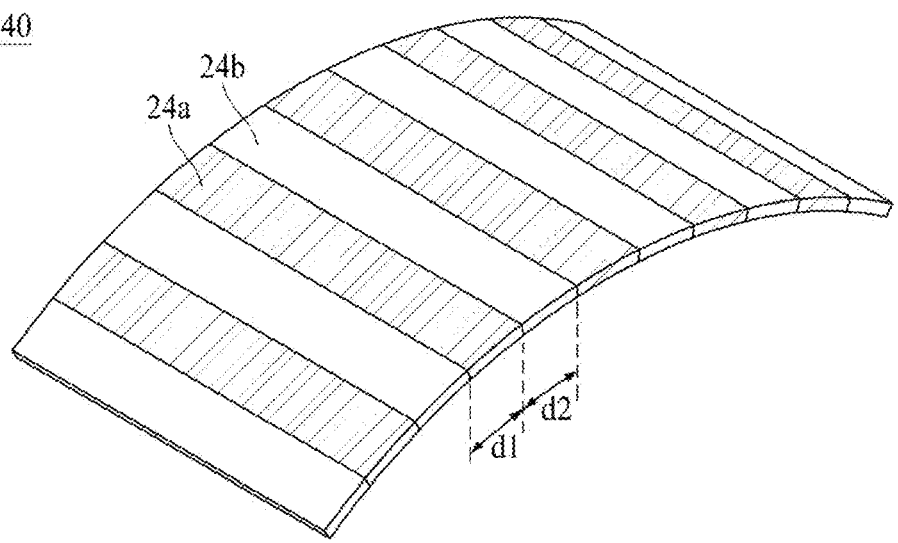

FIGS. 9A and 9B are diagrams illustrating another example of a first structure of a sound generating device according to an embodiment of the present disclosure.

FIG. 9A is a diagram illustrating an example where both ends of the inorganic material part and the organic material part of FIG. 8A are folded upward. FIG. 9A will be described with reference to FIG. 8A for example, and FIG. 8B may be identically applied thereto.

FIG. 9B is a diagram illustrating an example where the both ends of the inorganic material part and the organic material part of FIG. 9A are folded downward. FIG. 9B will be described with reference to FIG. 8A for example, and FIG. 8B may be identically applied thereto.

With reference to FIGS. 9A and 9B, in a sound generating device including an inorganic material part having a plurality of line patterns and an organic material part filling a space between adjacent inorganic material parts, even when both ends disposed at ends in a lengthwise direction of the plurality of line patterns are bent upward or downward, the inorganic material part may not be damaged or may not be reduced in performance. Therefore, a display apparatus including the sound generating device which includes the inorganic material part having a plurality of line patterns and the organic material part filling a space between adjacent inorganic material parts may be applied to a curved display apparatus having a certain curvature, but embodiments are not limited thereto and may be applied to a rollable display apparatus or a bendable display apparatus. The bendable display apparatus may be, for example, an edge bending display apparatus, but embodiments are not limited thereto. As another example, the display apparatus may be applied to a wearable display apparatus.

Figure 10A:
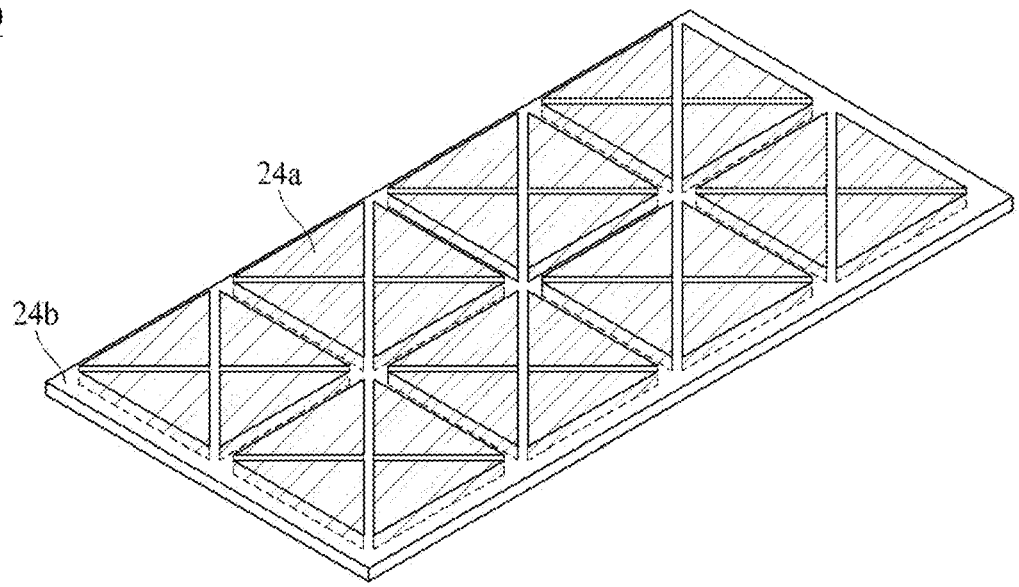
FIGS. 10A and 10B illustrate another example of a first structure of a sound generating device according to an embodiment of the present disclosure.
Figure 10B:
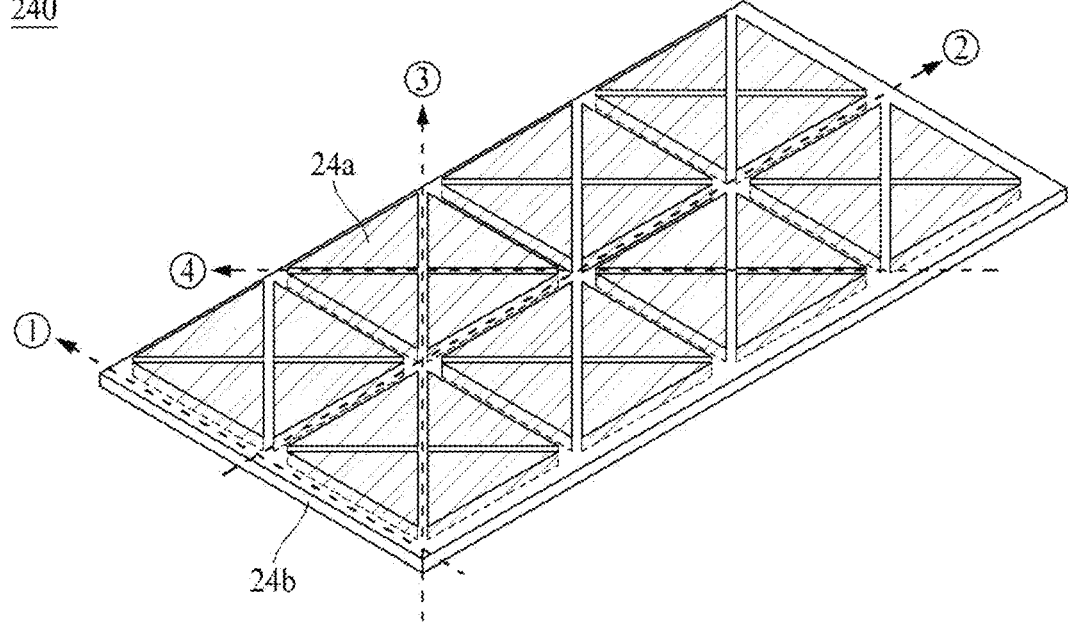

FIGS. 10A and 10B are diagrams illustrating another example of a first structure of a sound generating device according to an embodiment of the present disclosure.

With reference to FIG. 10A, an inorganic material part may be formed in a plurality of triangular patterns, and an organic material part may be disposed between one inorganic material part formed in a triangular pattern and another inorganic material part which is adjacent thereto and is formed in a triangular pattern. A display apparatus including a sound generating device having a structure illustrated in FIG. 10A may be adjusted in order for a display panel to have various shapes. Also, a plurality of triangular patterns may be a fine pattern capable of corresponding to various shapes, and in a case which finely forms a triangular pattern, the pattern may be modified to correspond to various deformations of a display panel.

Therefore, a display apparatus including a sound generating device which includes an inorganic material part formed in a plurality of polygonal patterns or a plurality of circular patterns and an organic material part filling a space between adjacent inorganic material parts may be deformed based on various deformations or bending thereof and may be prevented from being damaged by deformation or may be prevented from being reduced in performance. Therefore, the display apparatus including the sound generating device which includes the inorganic material part formed in a plurality of polygonal patterns or a plurality of circular patterns and the organic material part filling a space between adjacent inorganic material parts may be applied to a curved display apparatus having a certain curvature, but embodiments are not limited thereto and may be applied to a rollable display apparatus or a bendable display apparatus. The bendable display apparatus may be, for example, an edge bending display apparatus, but embodiments are not limited thereto. As another example, the display apparatus may be applied to a wearable display apparatus.

FIG. 10B is a diagram for describing a method of manufacturing the sound generating device of FIG. 10A. Numbers of FIG. 10B represent order in which an inorganic material part having a plate or sheet shape is formed and diced.

In FIG. 10B, ① and ⓪ respectively represent dicing performed in a widthwise direction and dicing performed in a lengthwise direction on an inorganic material part. In this case, the inorganic material part may move by a certain interval to correspond to a width or a shape of the inorganic material part which is set after dicing is performed once, and dicing may be performed a plurality of times or may be performed once or more. In FIG. 10B, ③ and ④ represent dicing performed in a diagonal direction on the inorganic material part. In this case, the inorganic material part may move by a certain interval to correspond to a width or a shape of the inorganic material part which is set after dicing is performed once, and dicing may be performed a plurality of times or may be performed once or more. A method of dicing an inorganic material part is not limited thereto.

Figure 11:
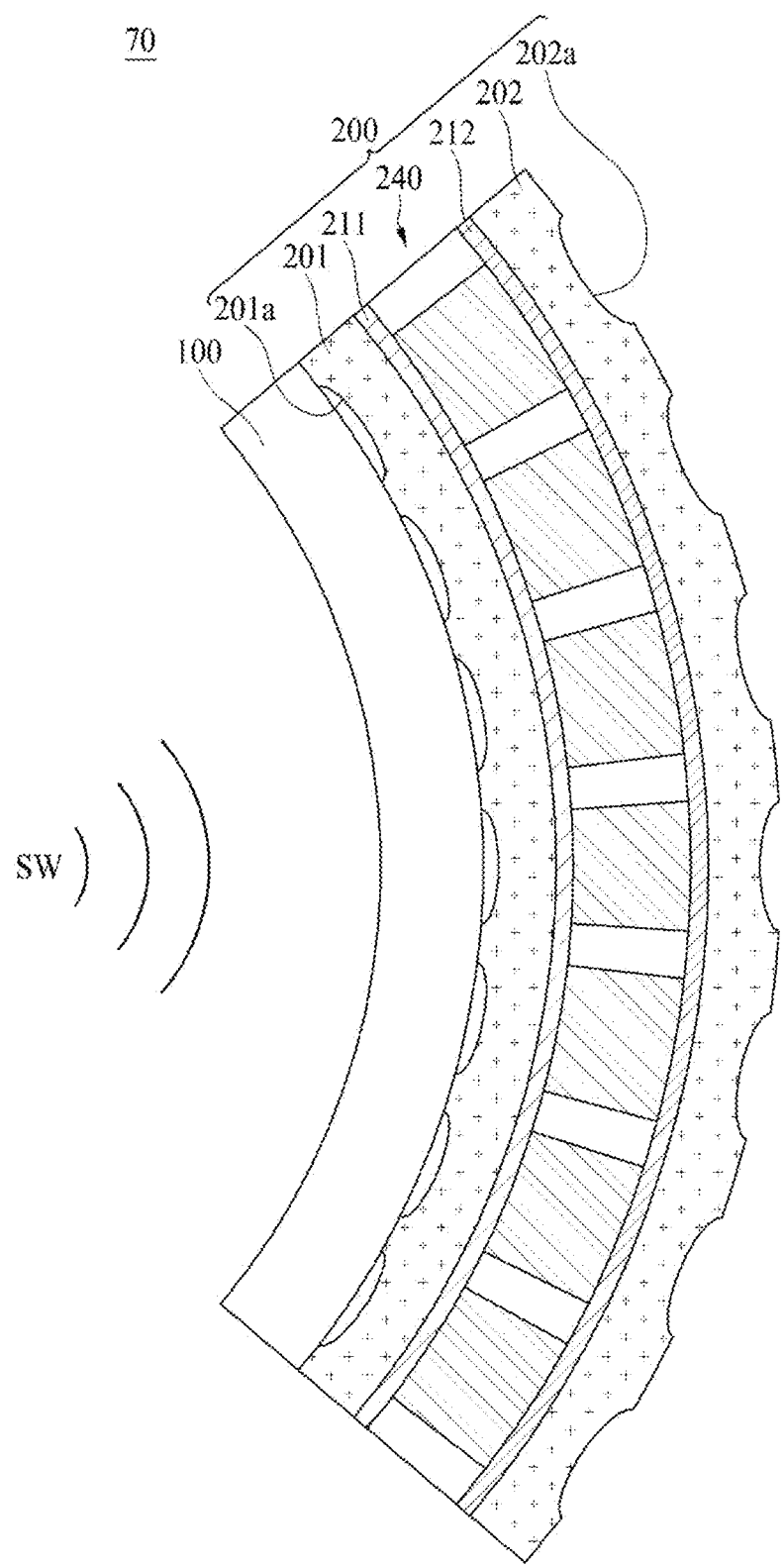
FIG. 11 illustrates a display apparatus according to an embodiment of the present disclosure.

FIG. 11 is a diagram illustrating a display apparatus according to an embodiment of the present disclosure.

With reference to FIG. 11, a display apparatus 70 according to an embodiment of the present disclosure may include a display panel 100 and a sound generating device 200. The sound generating device 200 may include a first structure 240. The sound generating device 200 is as described above with reference to FIGS. 5A to 10B, and thus, its detailed description is omitted. In FIG. 11, a sound generating device to which FIG. 5A is applied will be described, and moreover, the sound generating device of FIGS. 5B to 6C may be applied. With reference to FIG. 11, an example where the display apparatus 70 according to an embodiment of the present disclosure is folded inward from the display panel 100 is illustrated. An expansive stress which occurs when the display apparatus 70 is folded inward from the display panel 100 may be reduced in the first structure 240. In a case where the sound generating device 200 is applied to a foldable display apparatus, the display panel 100 may have a certain curvature radius in one direction, and the sound generating device may be bent correspondingly to a curvature of the display panel 100. As another example, the sound generating device 200 according to an embodiment of the present disclosure may be applied to a bendable or rollable display apparatus. Accordingly, a display apparatus with enhanced flexibility and sound pressure level may be provided.

Figure 12:
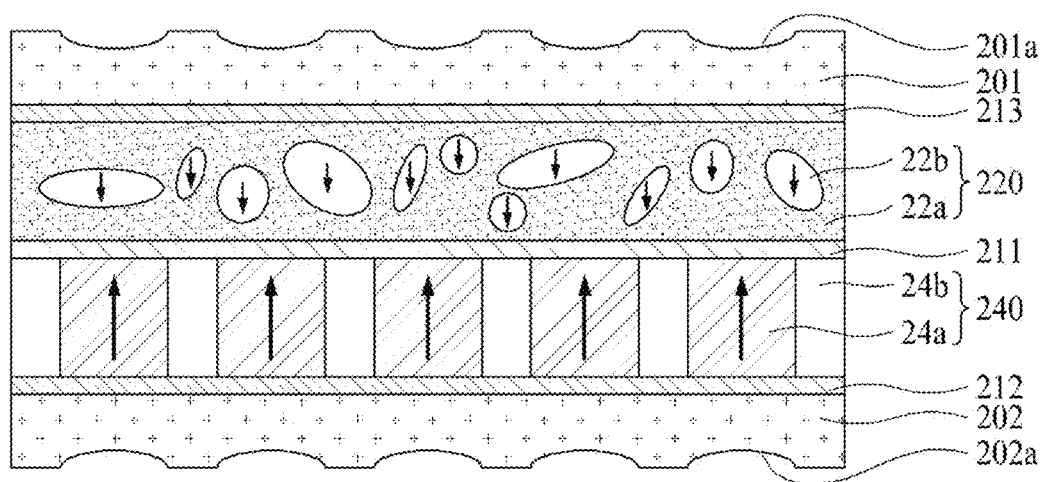
FIG. 12 illustrates a sound generating device according to an embodiment of the present disclosure.

FIG. 12 is a diagram illustrating a sound generating device 700 according to an embodiment of the present disclosure.

With reference to FIG. 12, the sound generating device 700 may include a first structure 240 and a second structure 220. When a speaker having a single layer of the second structure 220 is applied to a display apparatus, there may be vertical polarization not sufficient to vibrate the display panel 100, and due to this, there may be a problem where it is difficult to secure a sound pressure characteristic suitable for a speaker. Also, in a case where a speaker having a single layer of the first structure 240 is applied to a display apparatus, since it is possible to secure a sound characteristic suitable for a speaker by generating a sufficient vibration in a direction vertical to the first structure 240 but a portion having the piezoelectric properties of the first structure 240 is aligned in a horizontal direction with respect to a widthwise direction of the display panel 100, it is difficult to have a flexible characteristic other than a vertical direction with respect to an alignment direction, and it is difficult to secure an appropriate flexible characteristic in the vertical direction. In a case where the first structure 240 is formed of several layers or the second structure 220 is formed of several layers so as to secure a sufficient vibration capable of having a sound pressure characteristic and improve the flexibility of a speaker, a thickness of the speaker is thickened, and due to this, the display panel 100 is thickened.

For example, the second structure 220 may be disposed over the first structure 240. However, embodiments are not limited thereto, and the first structure 240 may be disposed over the second structure 220. The second structure 220 may be formed of a polymer piezoelectric material. For example, the second structure 220 may include a piezoelectric material 22b included in a polymer matrix 22a. The piezoelectric material 22b may be dispersed in the polymer matrix 22a. The polymer matrix 22a may include, for example, at least one of polyvinylidene fluoride (PVDF), β-Polyvinylidene fluoride (β-PVDF), polyvinylidene-trifluoroethylene (PVDF-TrFE), rubber, polyurethane, polyethylene, PTFE, polypropylene, nylon, polycarbonate, polyimide, epoxy resin, and acrylic resin, but embodiments are not limited thereto. The piezoelectric material 22b may be piezoelectric ceramic having a perovskite crystalline structure or a wurtzite crystalline structure, but embodiments are not limited thereto. The piezoelectric material 22b may include, for example, at least one of perovskite ($CaTiO_3$), barium titanate ($BaTiO_3$), lead zirconate titanate, (PZT) ($PbZrTiO_3$), quartz ($SiO_2$), strontium titanate ($SrTiO_3$), aluminum nitride (AlN), silver iodide (AgI), zinc oxide (ZnO), cadmium sulfide (CdS), cadmium selenide (CdSe), silicon carbide (α-SiC), gallium (III) nitride (GaN), and boron nitride (BN), but embodiments are not limited thereto.

The flexibility of the second structure 220 may be affected by the physical properties of the polymer matrix 22a, a size of the second structure 220, etc. For example, when a thickness of the second structure 220 is 300 μm or less, the second structure 220 may have flexibility, and the thickness is not limited thereto. The flexibility of the second structure 220 may be enhanced by adjusting a volume ratio of the polymer matrix 22a and the piezoelectric material 22b may be affected by a size of the second structure 220, a thickness of the second structure 220, a product with the second structure 220 applied thereto, and/or the like. For example, when the piezoelectric material 22b is formed of PZT and a volume ratio of PZT is 60%, the young's modulus of the second structure 220 may be 5.1 GPa. Accordingly, the polymer matrix 22a may have a volume ratio of 40%, and the piezoelectric material 22b may have a volume ratio of 60%. In this case, the flexibility of the second structure 220 may be enhanced.

The first structure 240 may include a first part 24a and a second part 24b disposed between adjacent first parts 24a. The first part 24a may include an inorganic material part, and the second part 24b may include an organic material part. The first structure is as described above with reference to FIGS. 5A to 10B, and thus, their detailed descriptions are omitted.

The sound generating device may include a first electrode 211 disposed over the first structure 240, a second electrode 212 disposed under the first structure 240, and a third electrode 213 disposed over the second structure 220. The first electrode 211, the second electrode 212, and the third electrode 213 may apply a voltage to the first structure 240 and the second structure 220. For example, the second electrode 212 and the third electrode 213 may be a positive (+) electrode, and the first electrode 211 may be a negative (−) electrode. As another example, the second electrode 212 and the third electrode 213 may be a negative (−) electrode, and the first electrode 211 may be a positive (+) electrode. For example, the first electrode 211, the second electrode 212, and the third electrode 213 may include one or more of carbon (C), palladium (Pd), iron (Fe), tin (Sn), aluminum (Al), nickel (Ni), platinum (Pt), gold (Au), silver (Ag), copper (Cu), titanium (Ti), and molybdenum (Mo), or an alloy thereof, but embodiments are not limited thereto. For example, the first electrode 211, the second electrode 212, and the third electrode 213 may include indium tin oxide (ITO) or a molybdenum-titanium alloy (a Mo—Ti alloy), but embodiments are not limited thereto.

When an alternating current (AC) voltage is applied to the first electrode 211, the second electrode 212, and the third electrode 213 of the sound generating device 700, the first structure 240 and the second structure 220 may alternately and repeatedly expand and contract, thereby generating a vibration based on a bending phenomenon where a bending direction is alternately changed. The display panel 100 may vibrate based on the generated vibration to generate a sound. The display panel 100 may vibrate with kinetic energy based on polarization which is performed in a direction vertical to the display panel 100. Therefore, polarization performed in a vector direction except the direction vertical to the display panel 100 may be lost. A whole vibration of the sound generating device 700 may be affected by summated energy in the vector direction vertical to the display panel 100, and thus, a polarization direction (illustrated by an arrow) of the first structure 240 and a polarization direction (illustrated by an arrow) of the second structure 220 may be a direction vertical to the display panel 100. The display panel 100 may vibrate based on the expansion and contraction of the first structure 240 and the second structure 220, and thus, when a polarization direction of the first structure 240 is opposite to that of the second structure 220, a sound pressure level of the sound generating device 700 may be enhanced. The second structure 220 may form a polarization direction vertical to the display panel 100, and thus, the polarization direction of the first structure 240 may be aligned in a direction vertical to the display panel 100, thereby increasing a vibration of the sound generating device 700. Accordingly, a sound pressure level of the sound generating device 700 may be more enhanced.

A first passivation layer 201 may be disposed over the third electrode 213, and a second passivation layer 202 may be disposed under the second electrode 212. When an external impact is applied, the first passivation layer 201 and the second passivation layer 202 may protect the first structure 240 and the second structure 220. For example, at least a portion of the first passivation layer 201 and the second passivation layer 202 may have a non-flat shape. The first passivation layer 201 and the second passivation layer 202 are as described above with reference to FIG. 5A, and thus, their detailed descriptions are omitted. Also, FIG. 12 may be applied to a sound generating device to which the passivation layers of FIGS. 5B to 6C are applied.

A size of the sound generating device 700 may be the same as that of the display panel 100. Since the sound generating device 700 is configured to secure a wide area corresponding to a size equal to that of the display panel 100, a sound characteristic of a low sound band may be improved compared to a film-type piezoelectric device, and a driving voltage may be reduced. For example, a size of the sound generating device 700 may be 0.9 to 1.1 times a size of a display area AA of the display panel 100, but embodiments are not limited thereto. Since a size of the sound generating device 700 is the same as or approximately equal to that of the display area AA of the display panel 100, the sound generating device 700 may cover a most region of the display panel 100, and a vibration generated by the sound generating device 700 may vibrate a whole portion of the display panel 100, thereby enhancing a sound localization. Also, in a large-sized display apparatus, a whole portion of the large-sized display apparatus may vibrate, and thus, a sound localization may be more enhanced, thereby realizing a stereo sound effect.

Therefore, since a sound generating device including a first structure and a second structure is implemented and passivation layers are respectively provided over and under an electrode, a sound pressure level of the sound generating device 700 may be more enhanced, thereby decreasing an impact applied to the sound generating device 700 when an external impact is applied thereto.

Figure 13A:
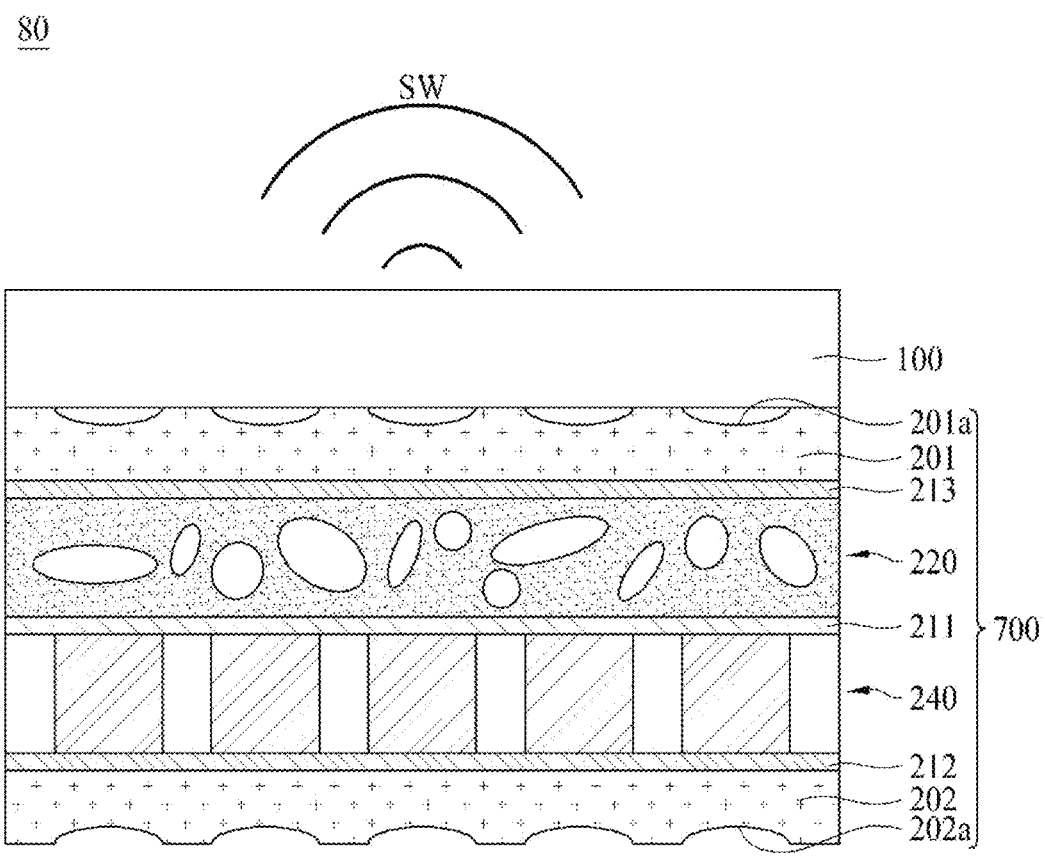
FIGS. 13A and 13B illustrate a display apparatus including a sound generating device according to an embodiment of the present disclosure.
Figure 13B:
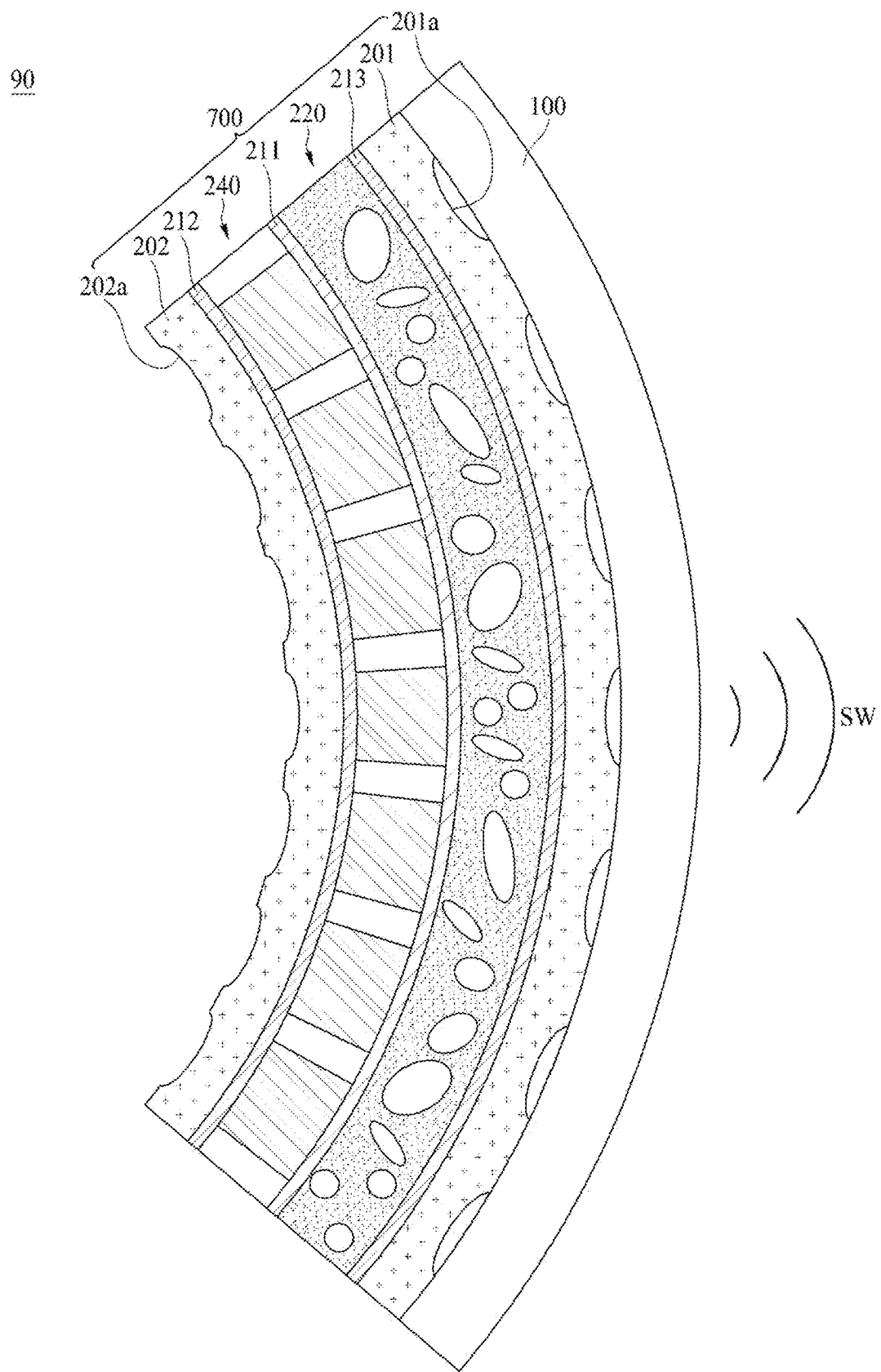

FIGS. 13A and 13B are diagrams illustrating a display apparatus including a sound generating device according to an embodiment of the present disclosure.

With reference to FIG. 13A, a display apparatus 80 according to an embodiment of the present disclosure may include a display panel 100 and a sound generating device 700. The sound generating device 700 may include a first structure 240 and a second structure 220. The sound generating device 700 may include a first electrode 211 disposed over the first structure 240, a second electrode 212 disposed under the first structure 240, and a third electrode 213 disposed over the second structure 220. The sound generating device 700 may vibrate the display panel 100 to generate a sound SW. For example, the sound generating device 700 may directly vibrate the display panel 100 to output the sound SW to a forward region in front of the display panel 100. The first structure 240 and the second structure 220 are as described above with reference to FIGS. 5A to 10B and 12, and thus, their detailed descriptions are omitted. An adhesive may be further provided between the first passivation layer 201 and the third electrode 213, and an adhesive may be further provided between the second passivation layer 202 and the second electrode 212. The adhesive may be, for example, an acrylic adhesive, an epoxy-based adhesive, and a silicon-based adhesive, and a functional group may be added to the adhesive to improve an adhesive force or a manufacturing process. However, embodiments are not limited thereto. Also, in order to improve an adhesive force to the first and second passivation layers 201 and 202 and/or enhance an elastic modulus suitable for the second electrode 212 or the third electrode 213, the adhesive may be used in common or mixed, or a thickness of the adhesive may be differently adjusted. However, embodiments are not limited thereto.

A young's modulus of the second structure 220 may be less than that of the first structure 240. For example, the young's modulus of the second structure 220 may be 1 GPa or less, and a young's modulus of the first structure 240 may be less than 50 GPa. The second structure 220 having a low young's modulus may be disposed more adjacent to the display panel 100 than the first structure 240, and thus, an external impact may be reduced by the second structure 220. Accordingly, the second structure 220 may be disposed more adjacent to the display panel 100 than the first structure 240, thereby providing a display apparatus with enhanced impact resistance and flexibility.

With reference to FIG. 13B, a display apparatus 90 according to an embodiment of the present disclosure may include a display panel 100 and a sound generating device 700. The sound generating device 700 may include a first structure 240 and a second structure 220. The second structure 220 may be disposed more adjacent to the display panel 100 than the first structure 240. The sound generating device 700 may include the second structure 220, thereby providing a display apparatus with enhanced impact resistance and flexibility. Therefore, the sound generating device 700 may have flexibility, and thus, may be applied to a flexible display apparatus. A foldable display apparatus is illustrated as an example of the display apparatus 90. For example, an example where the display panel 100 is outward folded is illustrated. When the display panel 100 is folded outward, a compressive stress may be released by the second structure 220 of the sound generating device 700 and may be transferred to the first structure 240, thereby providing a display apparatus with enhanced flexibility. Also, the second structure 220 of the sound generating device 700 may absorb impact energy against an external impact applied to the display panel 100 and may transfer remaining energy to the first structure 240, thereby providing a display apparatus with secured impact resistance. When the sound generating device 700 is applied to a foldable display apparatus, the display panel 100 may have a certain curvature radius in one direction, and the sound generating device 700 may be bent corresponding to a curvature of the display panel 100. As another example, the sound generating device 700 according to an embodiment of the present disclosure may be applied to a bendable or rollable display apparatus.

Figure 14:
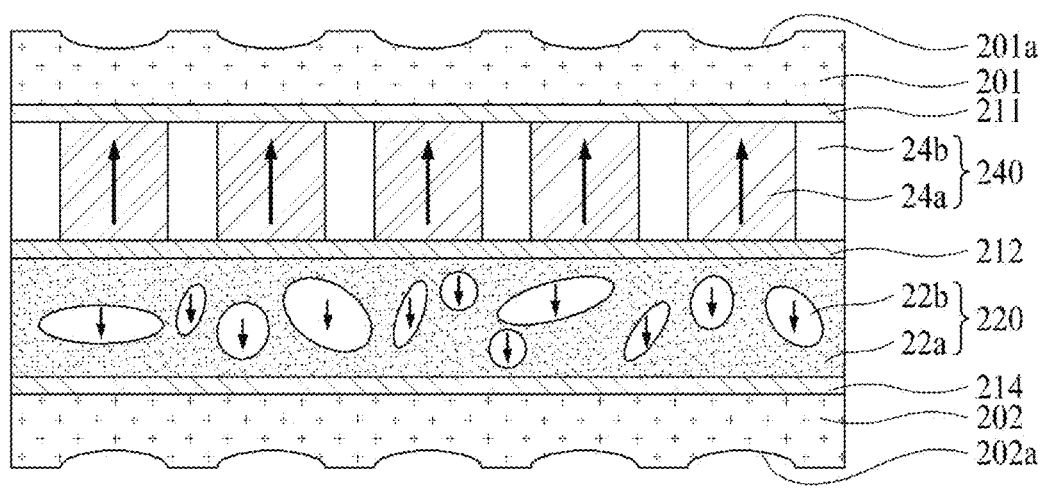
FIG. 14 illustrates a sound generating device according to an embodiment of the present disclosure.

FIG. 14 is a diagram illustrating a sound generating device according to an embodiment of the present disclosure.

With reference to FIG. 14, a first structure 240 of a sound generating device 800 according to an embodiment of the present disclosure may be disposed over a second structure 220. The sound generating device 800 may include a first electrode 211 disposed over the first structure 240, a second electrode 212 disposed under the first structure 240, and a fourth electrode 214 disposed under the second structure 220. The first electrode 211, the second electrode 212, and the fourth electrode 214 may apply a voltage to the first structure 240 and the second structure 220. For example, the first electrode 211 and the fourth electrode 214 may be a negative (−) electrode, and the second electrode 212 may be a positive (+) electrode. As another example, the first electrode 211 and the fourth electrode 214 may be a positive (+) electrode, and the second electrode 212 may be a negative (−) electrode. For example, the first electrode 211, the second electrode 212, and the fourth electrode 214 may include one or more of carbon (C), palladium (Pd), iron (Fe), tin (Sn), aluminum (Al), nickel (Ni), platinum (Pt), gold (Au), silver (Ag), copper (Cu), titanium (Ti), and molybdenum (Mo), or an alloy thereof, but embodiments are not limited thereto. For example, the first electrode 211, the second electrode 212, and the third electrode 213 may include ITO or a Mo—Ti alloy, but embodiments are not limited thereto.

When an AC voltage is applied to the first electrode 211, the second electrode 212, and the fourth electrode 214 of the sound generating device 800, the first structure 240 and the second structure 220 may alternately and repeatedly expand and contract, thereby generating a vibration based on a bending phenomenon where a bending direction is alternately changed. The display panel 100 may vibrate based on the generated vibration to generate a sound. The display panel 100 may vibrate with kinetic energy based on polarization which is performed in a direction vertical to the display panel 100. Therefore, polarization performed in a vector direction except the direction vertical to the display panel 100 may be lost. A whole vibration of the sound generating device 800 may be affected by summated energy in the vector direction vertical to the display panel 100, and thus, a polarization direction (illustrated by an arrow) of the first structure 240 and a polarization direction (illustrated by an arrow) of the second structure 220 may be a direction vertical to the display panel 100. The display panel 100 may vibrate based on the expansion and contraction of the first structure 240 and the second structure 220, and thus, when a polarization direction of the first structure 240 is opposite to that of the second structure 240, a sound pressure level of the sound generating device 800 may be enhanced. The sound generating device 800 may be configured by the first structure 240 and the second structure 220, the second structure 220 may form a polarization direction vertical to the display panel 100, and the polarization direction of the first structure 240 may be aligned in a direction vertical to the display panel 100, thereby increasing a vibration of the sound generating device 800. Accordingly, a sound pressure level of the sound generating device 800 may be more enhanced. Therefore, in the sound generating device 800 according to an embodiment of the present disclosure, since a polarization direction vertical to the display panel 100 is formed by the first structure 240, a sound characteristic may be secured, and a flexible characteristic may be secured by the second structure 220, thereby providing a display apparatus with enhanced sound characteristic and flexibility.

A first passivation layer 201 may be disposed over the first electrode 211, and a second passivation layer 202 may be disposed under the fourth electrode 214. When an external impact is applied, the first passivation layer 201 and the second passivation layer 202 may protect the first structure 240 and the second structure 220. For example, at least a portion of the first passivation layer 201 and the second passivation layer 202 may have a non-flat shape. The first passivation layer 201 and the second passivation layer 202 are as described above with reference to FIG. 5A, and thus, their detailed descriptions are omitted. Also, FIG. 14 may be applied to a sound generating device to which the passivation layers of FIGS. 5B to 6C are applied.

A size of the sound generating device 800 may be the same as that of the display panel 100. Since the sound generating device 800 is configured to secure a wide area corresponding to a size equal to that of the display panel 100, a sound characteristic of a low sound band may be improved compared to a film-type piezoelectric device, and a driving voltage may be reduced. For example, a size of the sound generating device 800 may be 0.9 to 1.1 times a size of a display area AA of the display panel 100, but embodiments are not limited thereto. Since a size of the sound generating device 800 is the same as or approximately equal to that of the display area AA of the display panel 100, the sound generating device 800 may cover a most region of the display panel 100, and a vibration generated by the sound generating device 800 may vibrate a whole portion of the display panel 100, thereby enhancing a sound localization. Also, in a large-sized display apparatus, a whole portion of the large-sized display apparatus may vibrate, and thus, a sound localization may be more enhanced, thereby realizing a stereo sound effect.

Therefore, since a sound generating device includes a first structure having a piezoelectric characteristic and a second structure having an impact resistance and flexibility, the impact resistance and flexibility of the sound generating device may be secured. Accordingly, a display apparatus having an excellent vibration characteristic and an excellent sound characteristic may be provided. Also, since a sound generating device including a first structure and a second structure is implemented and passivation layers are respectively provided over and under an electrode, a sound pressure level of the sound generating device may be more enhanced, thereby decreasing an impact applied to the sound generating device when an external impact is applied thereto.

Figure 15A:
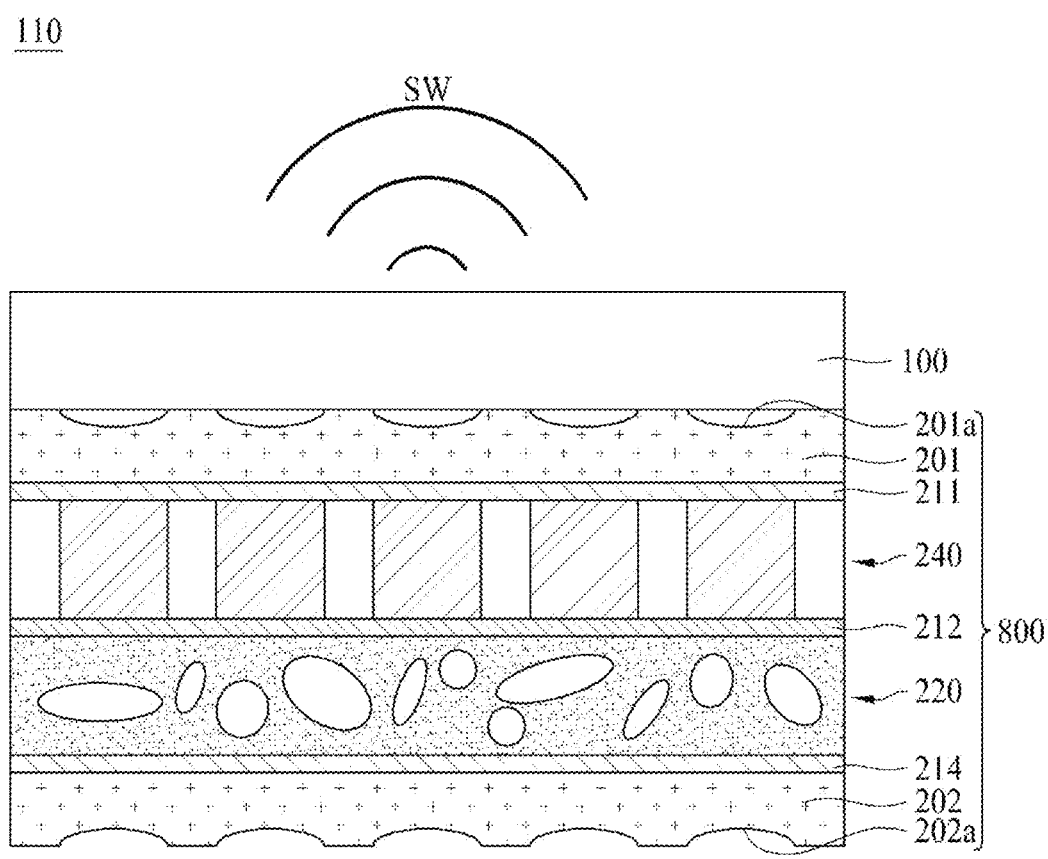
FIGS. 15A to 15C illustrate a display apparatus including a sound generating device according to an embodiment of the present disclosure.
Figure 15B:
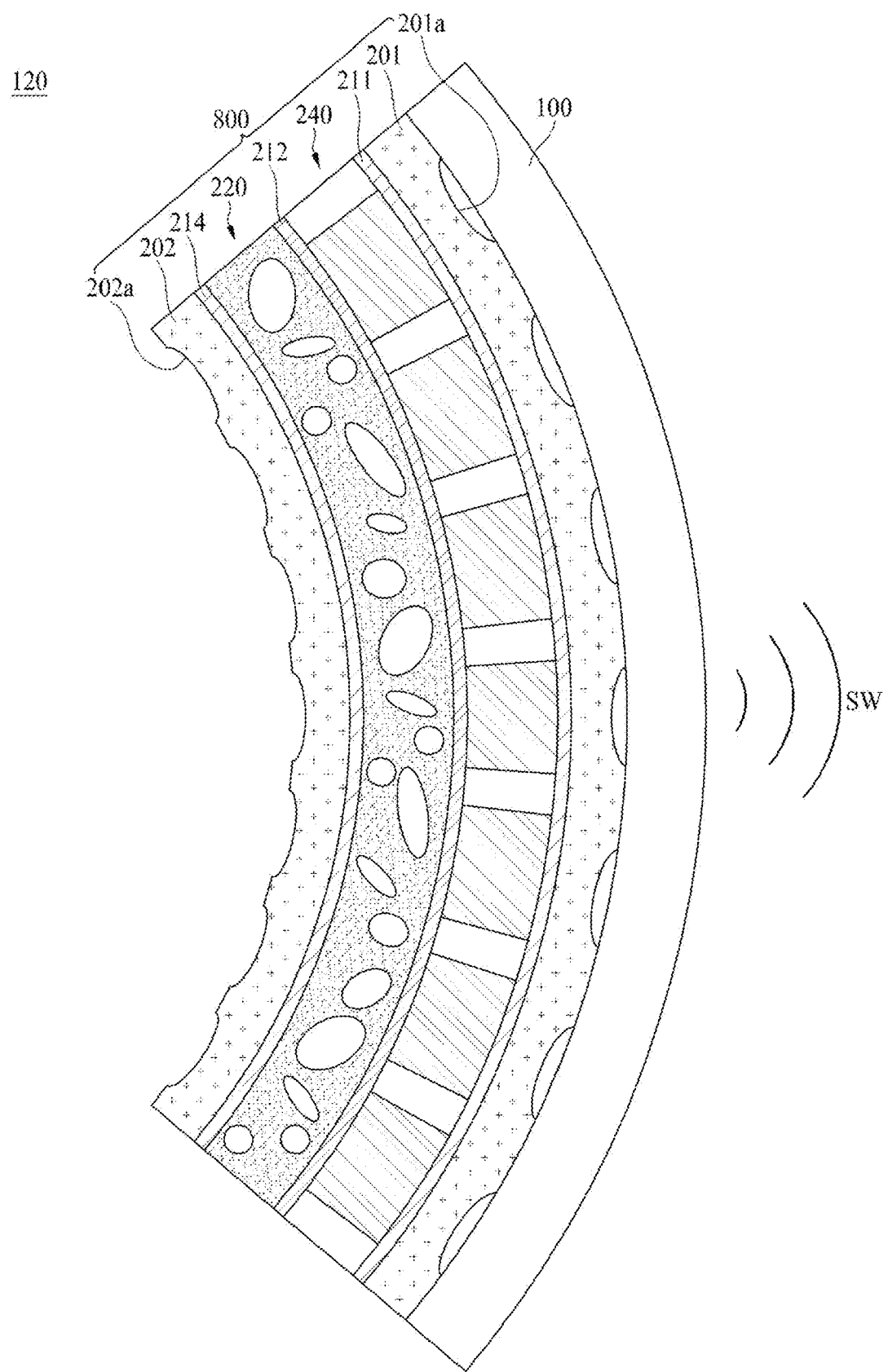
Figure 15C:
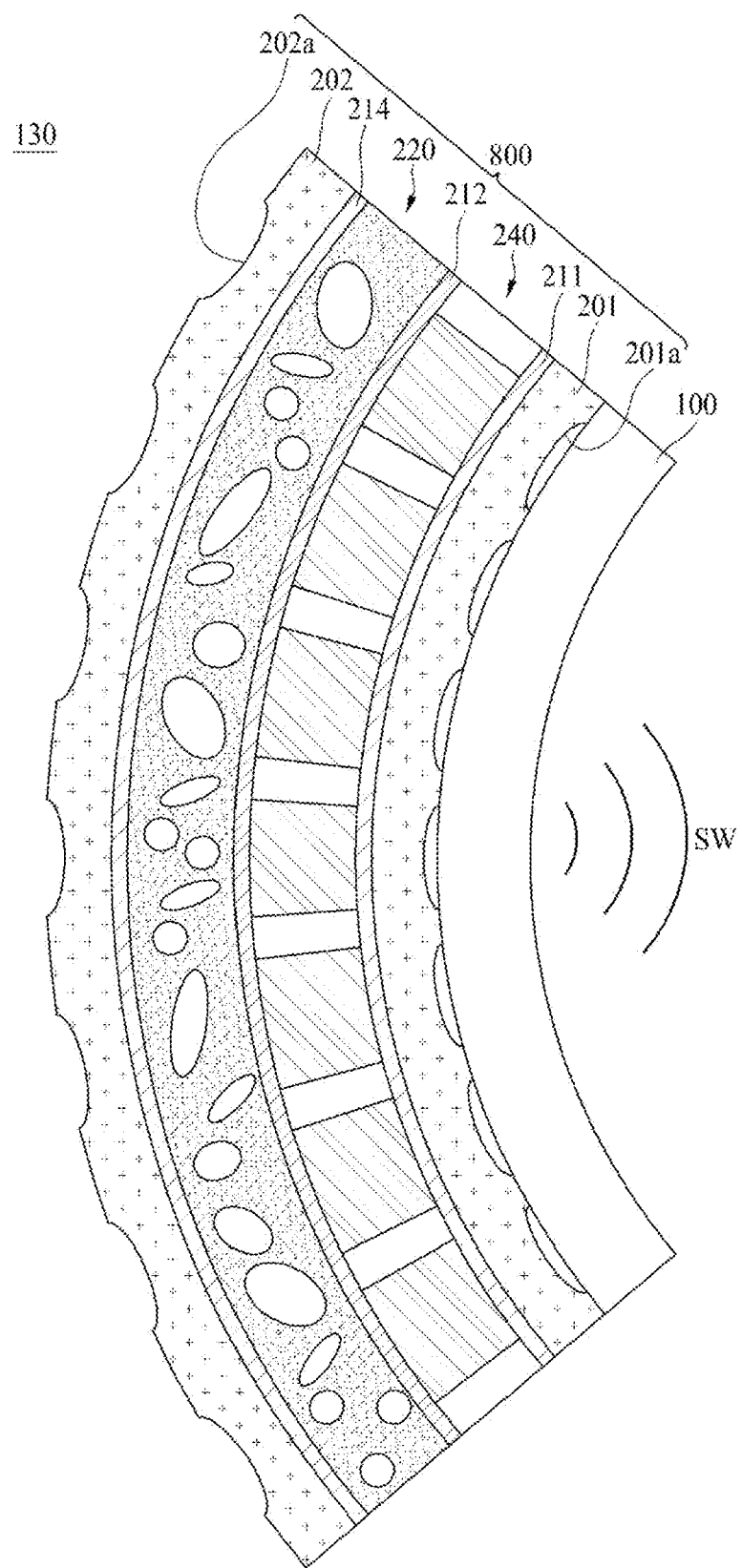

FIGS. 15A to 15C are diagrams illustrating a display apparatus including a sound generating device according to an embodiment of the present disclosure.

With reference to FIG. 15A, a display apparatus 110 according to an embodiment of the present disclosure may include a display panel 100 and a sound generating device 800. The sound generating device 800 may include a first structure 240 and a second structure 220. The sound generating device 800 may include a first electrode 211 disposed over the first structure 240, a second electrode 212 disposed under the first structure 240, and a fourth electrode 214 disposed under the second structure 220. The sound generating device 800 may vibrate the display panel 100 to generate a sound SW. For example, the sound generating device 800 may directly vibrate the display panel 100 to output the sound SW to a forward region in front of the display panel 100. The first structure 240 and the second structure 220 are as described above with reference to FIGS. 5A to 10B and 14, and thus, their detailed descriptions are omitted. An adhesive may be further provided between the first passivation layer 201 and the first electrode 211, and an adhesive may be further provided between the second passivation layer 202 and the fourth electrode 214. The adhesives may be, for example, an acrylic adhesive, an epoxy-based adhesive, and a silicon-based adhesive, and a functional group may be added to the adhesive so as to improve an adhesive force or a manufacturing process. However, embodiments are not limited thereto. Also, in order to improve an adhesive force to the first and second passivation layers 201 and 202 and/or enhance an elastic modulus suitable for the first electrode 211 or the fourth electrode 214, the adhesive may be used in common or mixed, or a thickness of the adhesive may be differently adjusted. However, embodiments are not limited thereto.

The first structure 240 may be disposed more adjacent to the display panel 100 than the second structure 220. Therefore, a vibration generated by the first structure 240 may be directly transferred to the display panel 100, and the loss of a vibration needed for generating a sound pressure may be minimized, thereby easily securing a sound pressure level suitable for a speaker. Also, since the loss of a vibration is minimized, an efficiency of generating a sound pressure may increase, and thus, a voltage applied to the sound generating device 800 may be reduced, thereby decreasing power consumption. Accordingly, the sound generating device 800 may have flexibility by using the second structure 220, thereby providing a sound generating device with enhanced flexibility and sound pressure level.

With reference to FIG. 15B, a display apparatus 120 according to an embodiment of the present disclosure may include a display panel 100 and a sound generating device 800. In a sound generating device using a voice coil or a piezoelectric ceramic, it is difficult to apply the sound generating device to a flexible display apparatus. For example, in a case where a voice coil or a piezoelectric ceramic is applied to a sound generating device, a separate structure may be needed for applying the sound generating device to a flexible display apparatus, and due to this, since a thickness of a display apparatus is thickened or a flexible characteristic is limited to a certain level or less, a problem of a material should be solved. The sound generating device 800 according to an embodiment of the present disclosure may have flexibility, and thus, may be applied to a flexible display apparatus. A foldable display apparatus is illustrated as an example of the display apparatus 120. For example, an example where the display apparatus 50 is folded outward from the display panel 100 is illustrated. A compressive stress which occurs when the display apparatus 120 is folded outward from the display panel 100 may be transferred to a second structure 220 through a first structure 240. A compression deformation rate based on the compressive stress which occurs when the display apparatus 120 is folded outward from the display panel 100 may increase in a direction distancing from the display panel 100 corresponding to a point at which the compressive stress occurs, and thus, the compressive stress may be more efficiently released by the second structure 220 having flexibility, thereby providing a display apparatus with more enhanced flexibility.

With reference to FIG. 15C, an example where a display apparatus 130 according to an embodiment of the present disclosure is folded inward from a display panel 100 is illustrated. An expansive stress which occurs when the display apparatus 130 is folded inward from the display panel 100 may be transferred to a second structure 220 through a first structure 240. An expansion deformation rate based on the expansive stress which occurs when the display apparatus 130 is folded inward from the display panel 100 may increase in a direction distancing from the display panel 100 corresponding to a point at which the expansive stress occurs, and thus, the expansive stress may be more efficiently released by the second structure 220 having flexibility, thereby providing a display apparatus with more enhanced flexibility. In a case where a sound generating device is applied to a foldable display apparatus, the display panel 100 may have a certain curvature radius in one direction, and the sound generating device may be bent correspondingly to a curvature of the display panel 100. As another example, a sound generating device 800 according to an embodiment of the present disclosure may be applied to a bendable or rollable display apparatus. Accordingly, a display apparatus with enhanced flexibility and sound pressure level may be provided.

As described above with reference to FIGS. 12 to 15C, in a case where a sound generating device including a first structure and a second structure is provided, an impact resistance and flexibility may be secured, and flexibility and a sound pressure level may be enhanced. For example, in a case where a display apparatus is configured with the sound generating device of FIGS. 12 to 13B, an impact resistance and flexibility may be secured, and in a case where a display apparatus is configured with the sound generating device of FIGS. 14 to 15C, flexibility and a sound pressure level may be enhanced. Therefore, the inventors have performed various experiments for implementing a sound generating device for enhancing an impact resistance, flexibility, and a sound pressure level. This will be described below with reference to FIGS. 14 to 19B.

Figure 16:
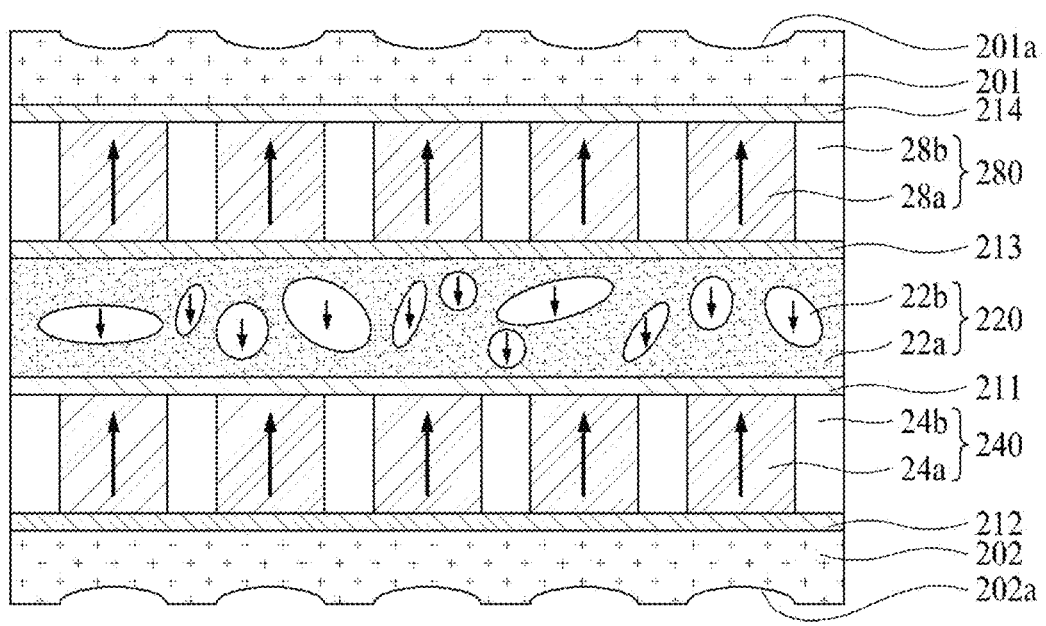
FIG. 16 illustrates a sound generating device according to an embodiment of the present disclosure.
Figure 17:
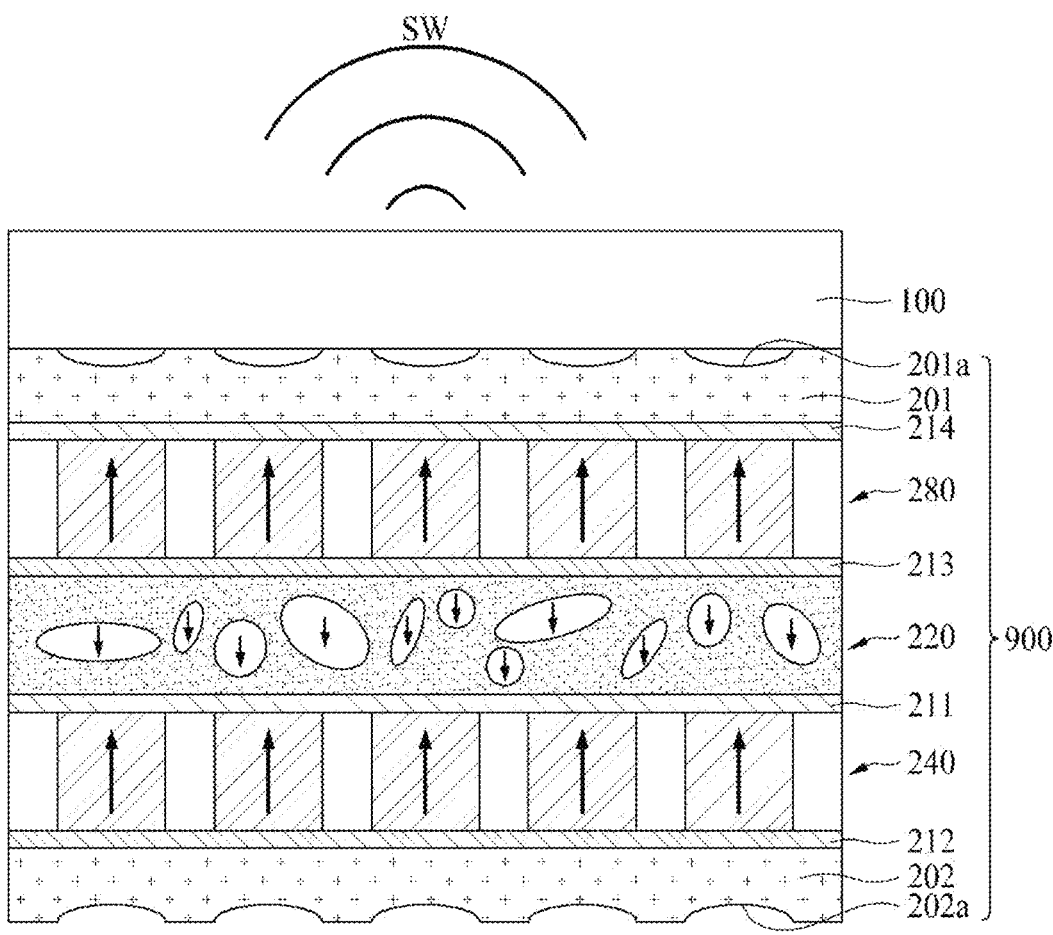
FIG. 17 illustrates a display apparatus including a sound generating device according to an embodiment of the present disclosure.

FIG. 16 is a diagram illustrating a sound generating device according to an embodiment of the present disclosure, and FIG. 17 is a diagram illustrating a display apparatus including a sound generating device according to an embodiment of the present disclosure.

With reference to FIGS. 16 and 17, a display apparatus 140 according to an embodiment of the present disclosure may include a display panel 100 and a sound generating device 900. The sound generating device 900 may include a first structure 240, a second structure 220, and a third structure 280. The first structure and the second structure are as described above with reference to FIGS. 5A to 10B and 12 to 13B, and thus, their detailed descriptions are omitted or will be briefly given below. A first passivation layer 201 and a second passivation layer 202 are as described above with reference to FIG. 5A, and thus, their detailed descriptions are omitted. Also, FIG. 16 may be applied to a sound generating device to which the passivation layers of FIGS. 5B to 6C are applied.

When the second structure 220 is provided more adjacent to the display panel 100 than the first structure 240, an impact resistance and flexibility may be enhanced by the second structure 220. In such a structure, a sound pressure level may not be secured. Therefore, the inventors have performed various experiments for placing a third structure so as to more enhance a sound pressure level of a sound generating device. In order to more enhance the sound pressure level of the sound generating device, the third structure 280 may be disposed over the second structure 220, and the third structure 280 may be disposed to have the same configuration as that of the first structure 240. The third structure 280 may be disposed over the second structure 220. As another example, the third structure 280 may be disposed under or over the first structure 240. The third structure 280 may be disposed to have the same configuration as that of the first structure 240. For example, the third structure 280 may include a first part 28a and a second part 28b disposed between adjacent first parts 28a. The first part 28a may include an inorganic material part, and the second part 28b may include an organic material part. The sound generating device 900 may vibrate the display panel 100 to generate a sound SW. For example, the sound generating device 900 may directly vibrate the display panel 100 to output the sound SW to a forward region in front of the display panel 100. Therefore, since the third structure 280 is further provided, a vibration generated by the third structure 280 may be directly transferred to the display panel 100, and the loss of a vibration needed for generating a sound pressure may be minimized, thereby easily securing a sound pressure level suitable for a speaker. Also, since the loss of a vibration is minimized, an efficiency of generating a sound pressure may increase, and thus, a voltage applied to the sound generating device 900 may be reduced, thereby decreasing power consumption.

The sound generating device 900 may include a first electrode 211 disposed over the first structure 240, a second electrode 212 disposed under the first structure 240, a third electrode 213 disposed over the second structure 220, and a fourth electrode 214 disposed over the third structure 280. An adhesive may be further provided between the first passivation layer 201 and the fourth electrode 214, and an adhesive may be further provided between the second passivation layer 202 and the second electrode 212. The adhesives may be, for example, an acrylic adhesive, an epoxy-based adhesive, and a silicon-based adhesive, and a functional group may be added to the adhesive to improve an adhesive force or a manufacturing process. However, embodiments are not limited thereto. Also, in order to improve an adhesive force to the first and second passivation layers 201 and 202 and/or enhance an elastic modulus suitable for the second electrode 212 or the fourth electrode 214, the adhesive may be used in common or mixed, or a thickness of the adhesive may be differently adjusted. However, embodiments are not limited thereto.

The first electrode 211, the second electrode 212, the third electrode 213, and the fourth electrode 214 may apply a voltage to the first structure 240, the second structure 220, and the third structure 280. For example, the first electrode 211 and the fourth electrode 214 may be a negative (−) electrode, and the second electrode 212 and the third electrode 213 may be a positive (+) electrode. As another example, the first electrode 211 and the fourth electrode 214 may be a positive (+) electrode, and the second electrode 212 and the third electrode 213 may be a negative (−) electrode. For example, the first electrode 211, the second electrode 212, the third electrode 213, and the fourth electrode 214 may include one or more of carbon (C), palladium (Pd), iron (Fe), tin (Sn), aluminum (Al), nickel (Ni), platinum (Pt), gold (Au), silver (Ag), copper (Cu), titanium (Ti), and molybdenum (Mo), or an alloy thereof, but embodiments are not limited thereto. For example, the first electrode 211, the second electrode 212, the third electrode 213, and the fourth electrode 214 may include ITO or a Mo—Ti alloy, but embodiments are not limited thereto.

When an AC voltage is applied to the first electrode 211, the second electrode 212, the third electrode 213, and the fourth electrode 214 of the sound generating device 900, the first structure 240, the second structure 220, and the third structure 280 may alternately and repeatedly expand and contract, thereby generating a vibration based on a bending phenomenon where a bending direction is alternately changed. The display panel 100 may vibrate based on the generated vibration to generate a sound. The display panel 100 may vibrate with kinetic energy based on polarization which is performed in a direction vertical to the display panel 100. Therefore, polarization performed in a vector direction except the direction vertical to the display panel 100 may be lost. A whole vibration of the sound generating device 900 may be affected by summated energy in the vector direction vertical to the display panel 100, and thus, a polarization direction (illustrated by an arrow) of the first structure 240, a polarization direction (illustrated by an arrow) of the second structure 220, and a polarization direction (illustrated by an arrow) of the third structure 280 may be a direction vertical to the display panel 100. The display panel 100 may vibrate based on the expansion and contraction of the first structure 240, the second structure 220, and the third structure 280, and thus, when a polarization direction of the second structure 220 is opposite to that of the first structure 240 and the third structure 280, a sound pressure level of the sound generating device 900 may be enhanced. The first structure 240 and the third structure 280 may form a polarization direction vertical to the display panel 100, and the polarization direction of the second structure 220 may be aligned in a direction vertical to the display panel 100, thereby increasing a vibration of the sound generating device 900. Accordingly, a sound pressure level of the display apparatus 140 including the sound generating device 900 may be more enhanced.

Figure 18:
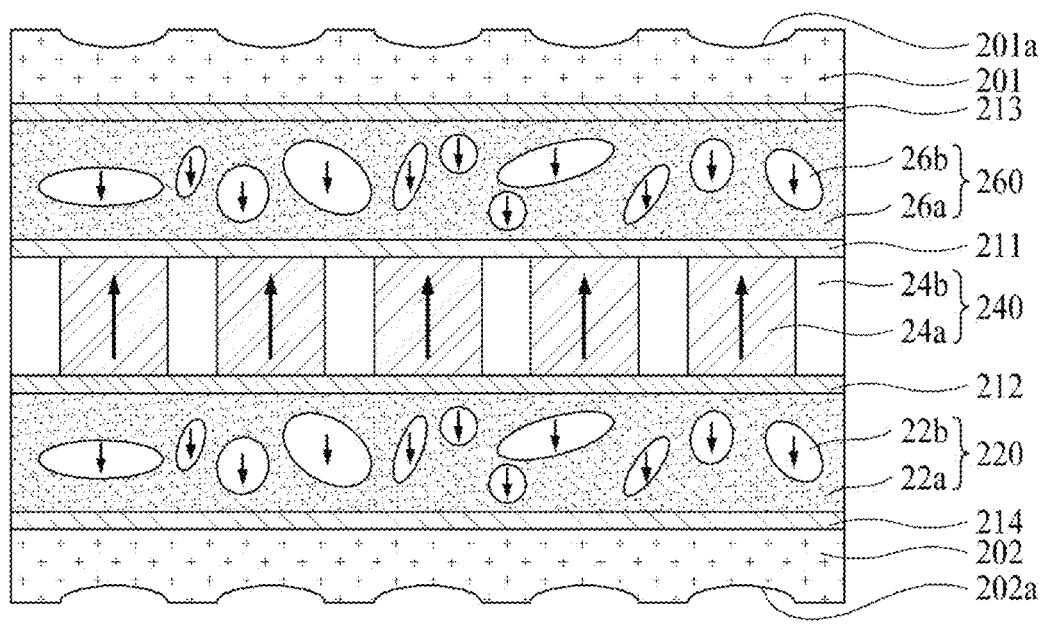
FIG. 18 illustrates a sound generating device according to an embodiment of the present disclosure.
Figure 19A:
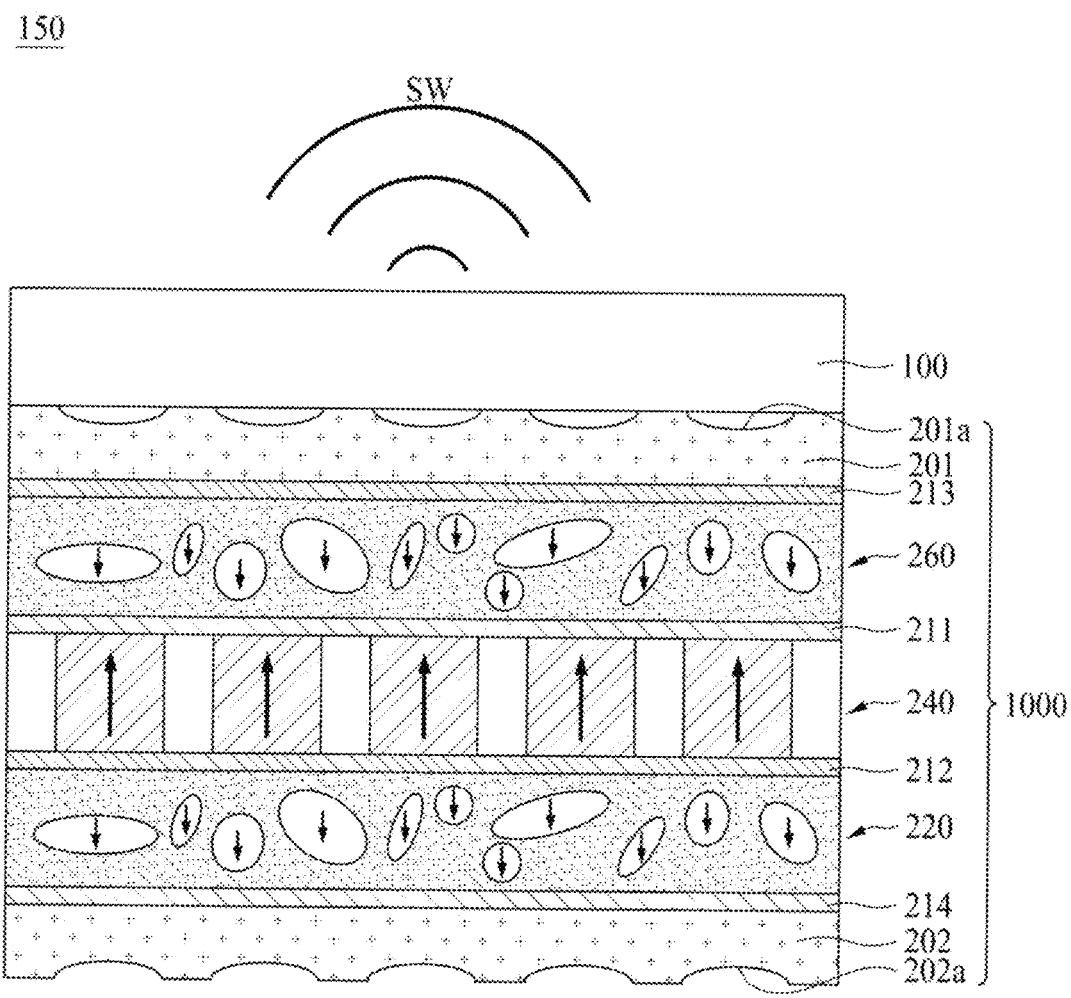
FIGS. 19A and 19B illustrate a display apparatus including a sound generating device according to an embodiment of the present disclosure.
Figure 19B:
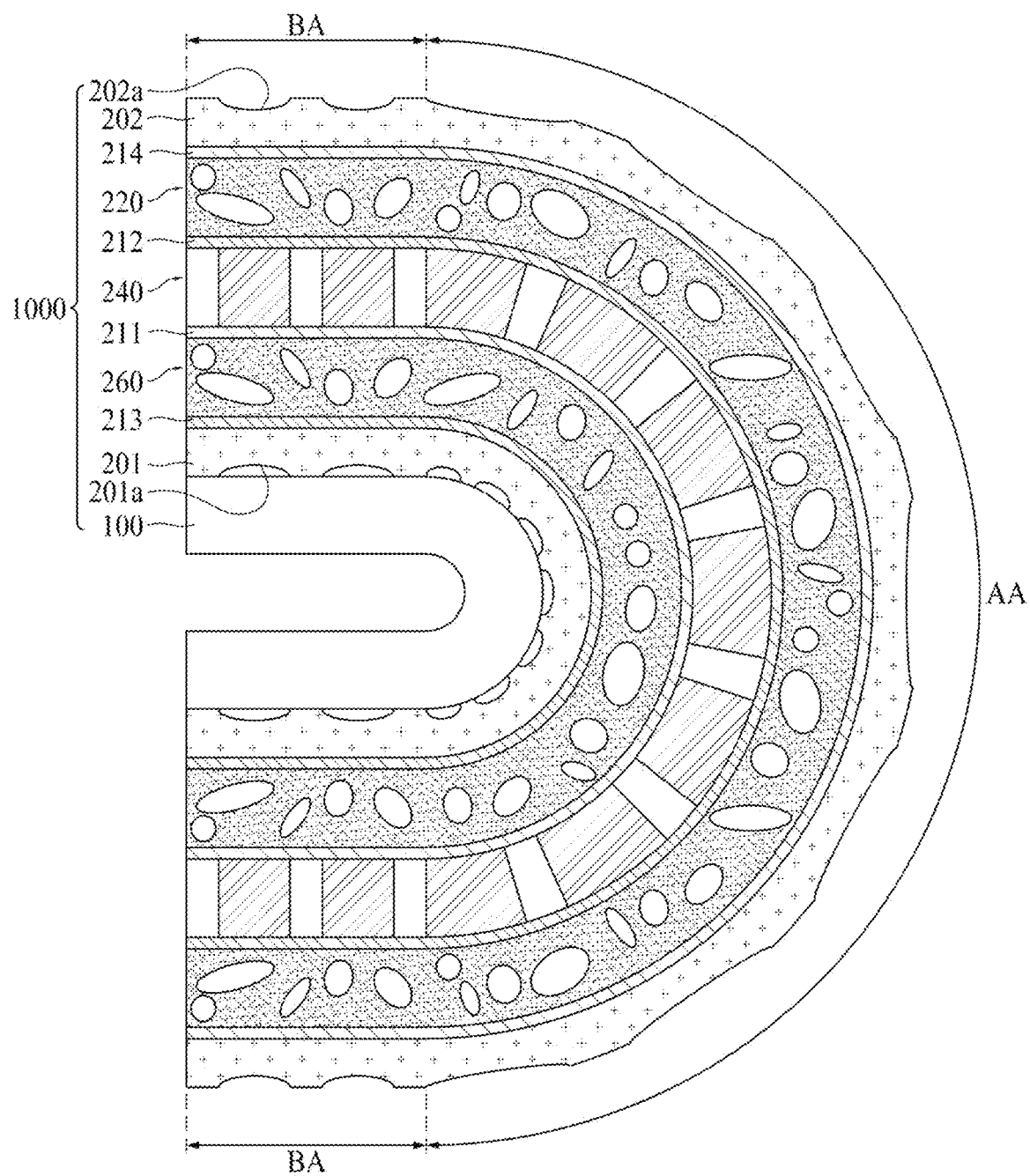

FIG. 18 is a diagram illustrating a sound generating device according to an embodiment of the present disclosure, and FIGS. 19A and 19B are diagrams illustrating a display apparatus including a sound generating device according to an embodiment of the present disclosure.

With reference to FIGS. 18 and 19A, a display apparatus 150 according to an embodiment of the present disclosure may include a display panel 100 and a sound generating device 1000. The sound generating device 1000 may include a first structure 240, a second structure 220, and a third structure 260. The first structure and the second structure are as described above with reference to FIGS. 5A to 10B and 14 to 15C, and thus, their detailed descriptions are omitted or will be briefly given below. A first passivation layer 201 and a second passivation layer 202 are as described above with reference to FIG. 5A, and thus, their detailed descriptions are omitted. Also, FIG. 18 may be applied to a sound generating device to which the passivation layers of FIGS. 5B to 6C are applied.

When the first structure 240 is provided more adjacent to the display panel 100 than the second structure 220, a sound pressure may be enhanced by the first structure 240. In such a structure, a flexibility level may not be secured. Therefore, the inventors have performed experiments for placing a third structure so as to more enhance a flexibility of a sound generating device. In order to more enhance the flexibility of the sound generating device, the third structure may be disposed over the first structure, and the third structure may be disposed to have the same configuration as that of the second structure. For example, the third structure 260 may be disposed under or over the first structure 240. As another example, the third structure 260 may be disposed under or over the second structure 220. The third structure 260 may be disposed to have the same configuration as that of the second structure 220. For example, the third structure 260 may include a polymer matrix 26a and a piezoelectric material 26b included in the polymer matrix 26a. The piezoelectric material 26b may be dispersed in the polymer matrix 26a. The sound generating device 1000 may vibrate the display panel 100 to generate a sound SW. For example, the sound generating device 1000 may directly vibrate the display panel 100 to output the sound SW to a forward region in front of the display panel 100. Therefore, since the third structure 260 is further provided, a sound generating device with more enhanced flexibility may be provided, thereby providing a display apparatus including a sound generating device with enhanced impact resistance, flexibility, and sound pressure level.

The sound generating device 1000 may include a first electrode 211 disposed over the first structure 240, a second electrode 212 disposed under the first structure 240, a fourth electrode 214 disposed under the second structure 240, and a third electrode 213 disposed over the third structure 260. An adhesive may be further provided between the first passivation layer 201 and the third electrode 213, and an adhesive may be further provided between the second passivation layer 202 and the fourth electrode 214. The adhesives may be, for example, an acrylic adhesive, an epoxy-based adhesive, and a silicon-based adhesive, and a functional group may be added to the adhesive to improve an adhesive force or a manufacturing process. However, embodiments are not limited thereto. Also, to improve an adhesive force to the first and second passivation layers 201 and 202 and/or enhance an elastic modulus suitable for the third electrode 213 or the fourth electrode 214, the adhesive may be used in common or mixed, or a thickness of the adhesive may be differently adjusted. However, embodiments are not limited thereto.

The first electrode 211, the second electrode 212, the third electrode 213, and the fourth electrode 214 may apply a voltage to the first structure 240, the second structure 220, and the third structure 260. For example, the first electrode 211 and the fourth electrode 214 may be a negative (−) electrode, and the second electrode 212 and the third electrode 213 may be a positive (+) electrode. As another example, the first electrode 211 and the fourth electrode 214 may be a positive (+) electrode, and the second electrode 212 and the third electrode 213 may be a negative (−) electrode. For example, the first electrode 211, the second electrode 212, the third electrode 213, and the fourth electrode 214 may include one or more of carbon (C), palladium (Pd), iron (Fe), tin (Sn), aluminum (Al), nickel (Ni), platinum (Pt), gold (Au), silver (Ag), copper (Cu), titanium (Ti), and molybdenum (Mo), or an alloy thereof, but embodiments are not limited thereto. For example, the first electrode 211, the second electrode 212, the third electrode 213, and the fourth electrode 214 may include ITO or a Mo—Ti alloy, but embodiments are not limited thereto.

When an AC voltage is applied to the first electrode 211, the second electrode 212, the third electrode 213, and the fourth electrode 214 of the sound generating device 1000, the first structure 240, the second structure 220, and the third structure 260 may alternately and repeatedly expand and contract, thereby generating a vibration based on a bending phenomenon where a bending direction is alternately changed. The display panel 100 may vibrate based on the generated vibration to generate a sound. The display panel 100 may vibrate with kinetic energy based on polarization which is performed in a direction vertical to the display panel 100. Therefore, polarization performed in a vector direction except the direction vertical to the display panel 100 may be lost. A whole vibration of the sound generating device 1000 may be affected by summated energy in the vector direction vertical to the display panel 100, and thus, a polarization direction (illustrated by an arrow) of the first structure 240, a polarization direction (illustrated by an arrow) of the second structure 220, and a polarization direction (illustrated by an arrow) of the third structure 260 may be a direction vertical to the display panel 100. The display panel 100 may vibrate based on the expansion and contraction of the first structure 240, the second structure 220, and the third structure 260, and thus, when a polarization direction of the second structure 220 and the third structure 260 is opposite to that of the first structure 240, a sound pressure level of the sound generating device 1000 may be enhanced. The first structure 240 may form a polarization direction vertical to the display panel 100, and the polarization direction of the second structure 220 and the third structure 260 may be aligned in a direction vertical to the display panel 100, thereby increasing a vibration of the sound generating device 1000. Accordingly, a sound pressure level of the sound generating device 1000 may be more enhanced. When the third structure 260 is disposed more adjacent to the display panel 100 than the first structure 240, flexibility may be enhanced by the second structure 220 and the third structure 260, and an impact resistance may be enhanced by the third structure 260. Accordingly, a display apparatus including a sound generating device with enhanced impact resistance, flexibility, and sound pressure level may be provided.

With reference to FIG. 19B, a display apparatus 160 according to an embodiment of the present disclosure may include a display panel 100 and a sound generating device 1000. The sound generating device 1000 is as described above with reference to FIGS. 18 and 19A, and thus, its detailed description is omitted or will be briefly given below. In a sound generating device using a voice coil or a piezoelectric ceramic, it is difficult to apply the sound generating device to a flexible display apparatus. For example, in a case where a voice coil or a piezoelectric ceramic is applied to a sound generating device, a separate structure may be needed for applying the sound generating device to a flexible display apparatus, and due to this, since a thickness of a display apparatus is thickened or a flexible characteristic is limited to a certain level or less, a problem of a material should be solved. As described above with reference to FIGS. 18 and 19A, the sound generating device 1000 according to an embodiment of the present disclosure may have an impact resistance and flexibility, and thus, may be applied to a flexible display apparatus. A foldable display apparatus is illustrated as an example of the display apparatus 160. An example where the display apparatus 160 is a foldable display apparatus is illustrated. For example, an example where the display apparatus 160 is folded inward from the display panel 100 is illustrated. In a case where a third structure 260 is disposed more adjacent to the display panel 100 than a first structure 240, an expansive stress may be released in the third structure 260 when the display apparatus 160 is folded inward from the display panel 100 and may be transferred to the first structure 240, thereby more securing flexibility. Therefore, flexibility may be enhanced by a second structure 220 and the third structure 260, and when an external impact is applied, the second structure 220 and the third structure 260 may act as a protection layer for the first structure 240, thereby enhancing an impact resistance of the sound generating device 1000. In FIG. 19B, an example where a display panel is inward folded is illustrated, but the present embodiment may be applied to a display apparatus where a display panel is folded outward. When the display apparatus 160 is folded outward from the display panel 100, an compressive stress may be released in the second structure 220 and may be transferred to the first structure 240, thereby more securing flexibility.

In a case where a display panel is folded inward, a bending area BA may be bent to have a semicircular shape. A folded area may be the bending area BA. The bending area BA may be an area where a flexible substrate is bent. The flexible substrate may be formed of an insulating material having flexibility. For example, the flexible substrate may be formed of plastic such as polyimide, but embodiments are not limited thereto. Also, at least one back plate for supporting the flexible substrate may be further provided under the flexible substrate. The back plate may be formed as a plastic thin film which is formed of polyimide, polyethylene napthalate (PEN), polyethylene terephthalate (PET), other suitable polymers, or a combination thereof, but embodiments are not limited thereto. The flexible substrate may be configured so that the flexible substrate is maintained in a flat state without being bent in an area other than the bending area and only the bending area is bent. Therefore, the sound generating device 1000 may be disposed along the bending area BA and a display area AA. For example, the sound generating device 1000 may be disposed to have a curved surface which is bent correspondingly to the bending area BA. When the display panel 100 has a certain curvature radius in one direction, the sound generating device 1000 may be bent correspondingly to a curvature of the display panel 100. When the sound generating device 1000 is applied to a rollable display apparatus, the display panel 100 may be wound or unwound, the sound generating device 1000 may be disposed based on winding or unwinding of the display panel 100. Therefore, the sound generating device according to an embodiment of the present disclosure may be applied to a plastic electroluminescent display apparatus, a flexible display apparatus, a bendable display apparatus, a foldable display apparatus, a rollable display apparatus, etc. As another example, the sound generating device according to an embodiment of the present disclosure may be applied to a wearable display apparatus.

Figure 20:
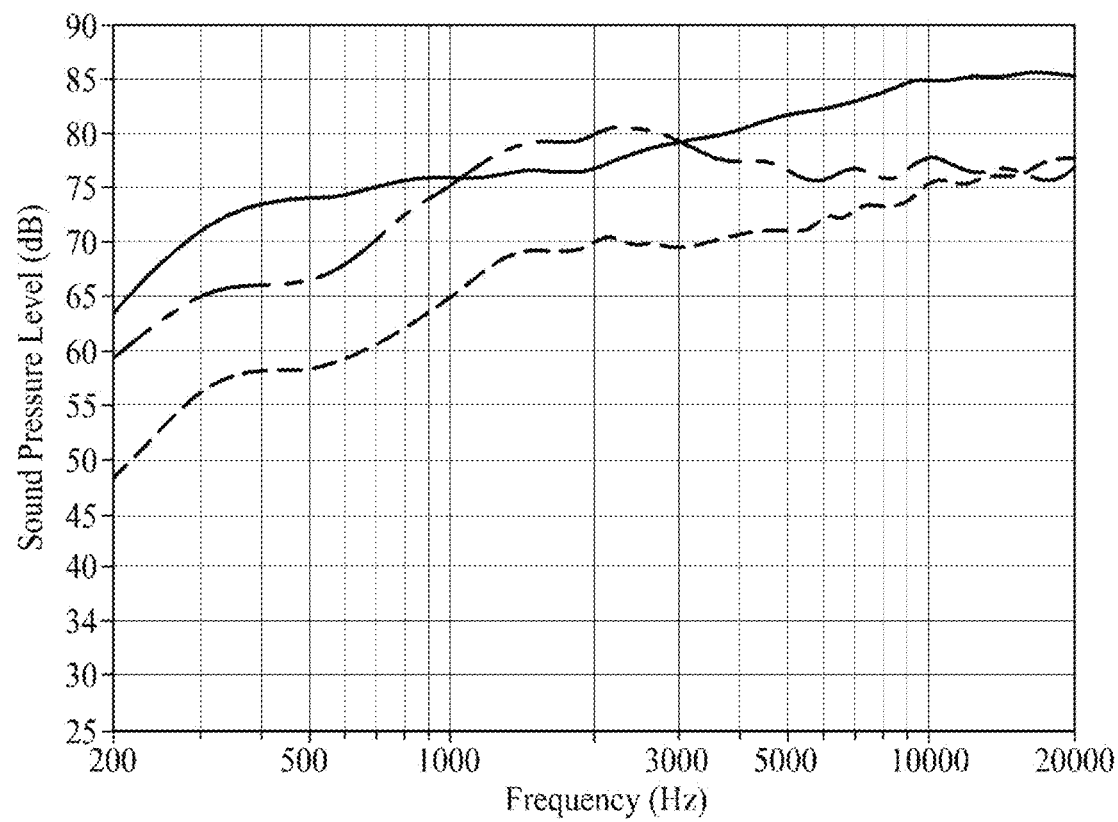
FIG. 20 illustrates a sound output characteristic of a sound generating device according to an embodiment of the present disclosure.

FIG. 20 is a diagram showing a sound output characteristic of a sound generating device according to an embodiment of the present disclosure.

In FIG. 20, the abscissa axis represents a frequency (Hz), and the ordinate axis represents a sound pressure level (SPL) (dB). A sound output characteristic has been measured in an anechoic chamber which is closed in all directions, and measurement equipment has used Audio Precision company's APX525. Measurement has been performed under a condition where a driving voltage is 10.6 Vrms and a sound pressure level measurement distance to a center of a sound generating module is about 5 cm. An applied frequency signal has been applied as a sine sweep within a range of 200 Hz to 20 kHz, and ⅓ octave smoothing has been performed on a measurement result. A measurement method is not limited thereto.

In FIG. 20, a dot line represents a display apparatus to which FIG. 3 is applied, a one-dot-dashed line represents a display apparatus (FIG. 5A) to which the sound generating device 200 according to an embodiment of the present disclosures is applied, and a solid line represents a display apparatus (FIG. 6A) to which the sound generating device 500 according to an embodiment of the present disclosures is applied. Measurement has been performed under a condition where an electrode is formed a Mo—Ti alloy, a passivation layer is formed of polyimide, the first part 24a of the first structure 240 is formed of a PZT-based material, and the second part 24b is formed of an epoxy-based polymer, but embodiments are not limited thereto. Even when FIGS. 5B, 5C, 6B, 6C, 11, 13A, 13B, 15A to 15C, 17, 19A, and 19B are applied, the same result or a similar result may be obtained as a sound output characteristic.

With reference to FIG. 20, comparing with a display apparatus which includes a passivation layer including a plurality of concave portions and a passivation layer including a plurality of convex portions and a plurality of concave portions, it may be seen that a sound pressure level is low in a whole frequency domain when a passivation layer according to an embodiment of the present disclosure is not applied. Comparing with a case where a passivation layer including a plurality of concave portions is applied, it may be seen that a sound is enhanced when a passivation layer including a plurality of convex portions and a plurality of concave portions is applied. Comparing with a case where FIG. 3 is applied, in a case where the sound generating device 200 according to an embodiment of the present disclosure is applied, it may be seen that a sound pressure level is enhanced in a frequency domain of about 0.2 kHz or higher, and it may be seen that a sound pressure level increase by about 10 dB or more in a frequency band of 1 kHz to 3 kHz occupying a large part of frequency band in an audible sound of a sound generating device which is a speaker. Comparing with a case where FIG. 3 is applied, in a case where the sound generating device 500 according to an embodiment of the present disclosure is applied, it may be seen that a sound pressure level is enhanced in a frequency domain of about 0.2 kHz or higher, it may be seen that a sound pressure level increase by about 10 dB or more in a frequency band of 1 kHz to 3 kHz occupying a large part of frequency band in an audible sound of a sound generating device which is a speaker, and since a sound pressure level increase by about 10 dB or more in a low frequency domain of 200 Hz to 500 Hz corresponding to a drawback of a piezoelectric speaker, it may be seen that a total sound pressure characteristic is enhanced. Comparing with a case where the sound generating device 200 according to an embodiment of the present disclosure is applied, in a case where the sound generating device 500 according to an embodiment of the present disclosure is applied, it may be seen that a sound pressure level increase by about 5 dB to about 12 dB in a low frequency domain of 200 Hz to 500 Hz corresponding to a drawback of a piezoelectric speaker, and thus, a total sound pressure characteristic is enhanced. Therefore, the sound generating device according to an embodiment of the present disclosure may have an excellent vibration characteristic for enhancing a sound pressure level in a whole frequency domain, thereby providing a sound generating device having flexibility and an impact resistance. Also, the sound generating device according to an embodiment of the present disclosure may enhance a sound pressure level in a whole frequency domain, thereby providing a sound generating device capable of being applied to a display apparatus.

A sound generating device according to an embodiment of the present disclosure may be applied as a sound generating device in a display apparatus. A display apparatus according to an embodiment of the present disclosure may be applied to mobile apparatuses, video phones, smart watches, watch phones, wearable apparatuses, foldable apparatuses, rollable apparatuses, bendable apparatuses, flexible apparatuses, curved apparatuses, portable multimedia players (PMPs), personal digital assistants (PDAs), electronic organizers, desktop personal computers (PCs), laptop PCs, netbook computers, workstations, navigation apparatuses, automotive navigation apparatuses, automotive display apparatuses, TVs, wall paper display apparatuses, signage apparatuses, game machines, notebook computers, monitors, cameras, camcorders, home appliances, etc. Also, the sound generating device according to an embodiment of the present disclosure may be applied to organic light emitting lighting apparatuses or inorganic light emitting lighting apparatuses. When the sound generating device is applied to a lighting apparatus, the sound generating device may act as lighting and a speaker.

A display apparatus according to an embodiment of the present disclosure will be described below.

According to an embodiment of the present disclosure, a display apparatus includes a display panel configured to display an image and a sound generating device on a rear surface of the display panel, the sound generating device being configured to vibrate the display panel to generate sound, wherein the sound generating device includes a first structure and a first passivation layer on one side of the first structures, at least a portion of the first passivation layer having a non-flat shape.

For example, in a display apparatus according to an embodiment of the present disclosure, the first structure may include a first part having a piezoelectric characteristic and a second part between adjacent first parts to have flexibility.

For example, a display apparatus according to an embodiment of the present disclosure may further include a second passivation layer on the other side of the first structure, at least a portion of the second passivation layer having a non-flat shape.

For example, in a display apparatus according to an embodiment of the present disclosure, the non-flat shape may include a plurality of concave portions, or a plurality of concave portions and a plurality of convex portions.

For example, in a display apparatus according to an embodiment of the present disclosure, the plurality of concave portions and the plurality of convex portions of the first passivation layer and the plurality of concave portions and the plurality of convex portions of the second passivation layer may be arranged in zigzag.

For example, in a display apparatus according to an embodiment of the present disclosure, the first structure may include an inorganic material part and an organic material part between adjacent inorganic material parts.

For example, in a display apparatus according to an embodiment of the present disclosure, the plurality of concave portions may correspond to the inorganic material part, or may correspond to the inorganic material part and the organic material part.

For example, in a display apparatus according to an embodiment of the present disclosure, the plurality of concave portions and the plurality of convex portions may be disposed correspondingly to the inorganic material part and the organic material part.

For example, in a display apparatus according to an embodiment of the present disclosure, each of the plurality of concave portions may correspond to at least two inorganic material parts and an organic material part between the at least two inorganic material parts, and each of the plurality of convex portions may correspond to at least two inorganic material parts and an organic material part between the at least two inorganic material parts.

For example, a display apparatus according to an embodiment of the present disclosure may further include a second structure over or under the first structure, the second structure including a polymer piezoelectric material.

For example, a display apparatus according to an embodiment of the present disclosure may further include a third structure over the second structure, the third structure being the same as the first structure, wherein the second structure may be disposed more adjacent to the display panel than the first structure.

For example, in a display apparatus according to an embodiment of the present disclosure, a polarization direction of the second structure may be opposite to a polarization direction of the first structure and a polarization direction of the third structure.

For example, a display apparatus according to an embodiment of the present disclosure may further include a third structure over the first structure, the third structure being the same as the second structure, wherein the first structure may be disposed more adjacent to the display panel than the second structure.

For example, in a display apparatus according to an embodiment of the present disclosure, a polarization direction of the first structure may be opposite to a polarization direction of the second structure and a polarization direction of the third structure.

For example, in a display apparatus according to an embodiment of the present disclosure, the first passivation layer may have an embossing shape including a plurality of concave portions and a plurality of convex portions using an embossing roller.

According to an embodiment of the present disclosure, a display apparatus includes a display panel including a display area configured to display an image and a non-display area surrounding the display area and a sound generating device on a rear surface of the display panel, the sound generating device being configured to vibrate the display panel to generate sound, wherein the sound generating device includes a first structure including a first part having a piezoelectric characteristic and a second part between adjacent first parts to have flexibility and a passivation layer over or under the first structure, the passivation layer including a plurality of concave portions.

For example, in a display apparatus according to an embodiment of the present disclosure, the first part may include an inorganic material part, and the second part may include an organic material part.

For example, in a display apparatus according to an embodiment of the present disclosure, the plurality of concave portions may be disposed correspondingly to the first part, or may be disposed correspondingly to the first part and the second part.

For example, a display apparatus according to an embodiment of the present disclosure may further include a plurality of convex portions under the plurality of concave portions, wherein the plurality of concave portions and the plurality of convex portions may be disposed to correspond to the first part and the second part.

For example, a display apparatus according to an embodiment of the present disclosure may further include a second structure over or under the first structure, the second structure including a polymer piezoelectric material.

For example, a display apparatus according to an embodiment of the present disclosure may further include a third structure over the second structure, the third structure being the same as the first structure, wherein the second structure may be disposed more adjacent to the display panel than the first structure.

For example, in a display apparatus according to an embodiment of the present disclosure, a polarization direction of the second structure may be opposite to a polarization direction of the first structure and a polarization direction of the third structure.

For example, a display apparatus according to an embodiment of the present disclosure may further include a third structure over the first structure, the third structure being the same as the second structure, wherein the first structure may be disposed more adjacent to the display panel than the second structure.

For example, in a display apparatus according to an embodiment of the present disclosure, a polarization direction of the first structure may be opposite to a polarization direction of the second structure and a polarization direction of the third structure.

For example, in a display apparatus according to an embodiment of the present disclosure, the non-display area may include a bending area, and the sound generating device may be at the display area and the bending area and may include a curved surface along the bending area.

For example, in a display apparatus according to an embodiment of the present disclosure, the display panel may have a certain curvature radius, and the sound generating device may be bent based on a curvature of the display panel.

For example, in a display apparatus according to an embodiment of the present disclosure, the display panel may be capable of being wound or unwound, and the sound generating device may be disposed to be wound or unwound based on winding or unwinding of the display panel.

According to an embodiment of the present disclosure, a sound generating device includes a first structure including a first part having a piezoelectric characteristic and a second part between adjacent first parts to have flexibility and a first passivation layer on one side of the first structure, at least a portion of the first passivation layer having a non-flat shape.

For example, a sound generating device according to an embodiment of the present disclosure further include a second passivation layer on the other side of the first structure, wherein at least a portion of the second passivation layer having a non-flat shape.

For example, in a sound in generating device according to an embodiment of the present disclosure, the non-flat shape may include a plurality of concave portions, or a plurality of concave portions and a plurality of convex portions.

For example, in a sound generating device according to an embodiment of the present disclosure, each of the plurality of concave portions may correspond to at least two first parts and a second part between the at least two first parts, and each of the plurality of convex portions may correspond to at least two first parts and a second part between the at least two first parts.

It will be apparent to those skilled in the art that various modifications and variations may be made in the display apparatus of the present disclosure without departing from the technical idea or scope of the disclosure. Thus, it is intended that embodiments of the present disclosure cover the modifications and variations of the disclosure provided they come within the scope of the appended claims and their equivalents.

What is claimed is:

1. A display apparatus, comprising:
   a display panel configured to display an image; and
   a sound generating device on a rear surface of the display panel,
   wherein the sound generating device comprises:
   a first structure; and
   a first passivation layer at one side of the first structure, and
   wherein the first structure comprises a plurality of inorganic material parts and a plurality of flexible material parts alternatingly arranged in parallel on the same plane,
   wherein at least a portion of the first passivation layer has a non-flat shape, and
   wherein the non-flat shape of the first passivation layer comprises a plurality of concave portions, or a plurality of concave portions and a plurality of convex portions.

2. The display apparatus of claim 1, wherein each of the plurality of inorganic material parts includes a piezoelectric characteristic, and
   wherein each of the plurality of flexible material parts includes a polymer having flexibility.

3. The display apparatus of claim 1, wherein each of the plurality of flexible material parts includes at least one of an organic piezoelectric material and an organic non-piezoelectric material.

4. The display apparatus of claim 3, wherein the organic piezoelectric material includes a material having an electrically active characteristic, and/or
wherein the organic non-piezoelectric material includes at least one of an acrylic polymer, a silicon-based polymer, and an epoxy-based polymer.

5. The display apparatus of claim 1, further comprising a second passivation layer on another side of the first structure, at least a portion of the second passivation layer having a non-flat shape.

6. The display apparatus of claim 5,
wherein the non-flat shape of the second passivation layer comprises a plurality of concave portions, or a plurality of concave portions and a plurality of convex portions.

7. The display apparatus of claim 6, wherein the plurality of concave portions and the plurality of convex portions of the first passivation layer and the plurality of concave portions and the plurality of convex portions of the second passivation layer are arranged in a zigzag pattern.

8. The display apparatus of claim 7, wherein the plurality of concave portions correspond to the plurality of inorganic material parts, or the plurality of concave portions correspond to the plurality of inorganic material parts and the plurality of flexible material parts.

9. The display apparatus of claim 8, wherein the plurality of concave portions and the plurality of convex portions are disposed correspondingly to the plurality of inorganic material parts and the plurality of flexible material parts.

10. The display apparatus of claim 8, wherein:
each of the plurality of concave portions corresponds to:
at least two inorganic material parts among the plurality of inorganic material parts; and
a flexible material part between the at least two inorganic material parts corresponding to a respective one of the concave portions; and
each of the plurality of convex portions corresponds to:
at least two inorganic material parts among the plurality of inorganic material parts; and
a flexible material part between the at least two inorganic material parts corresponding to a respective one of the convex portions.

11. The display apparatus of claim 10, wherein a polarization direction of the second structure is opposite to a polarization direction of the first structure and a polarization direction of the third structure.

12. The display apparatus of claim 1, further comprising a second structure over or under the first structure, the second structure including a polymer piezoelectric material.

13. The display apparatus of claim 12, further comprising a third structure over the second structure, the third structure being the same as the first structure.

14. The display apparatus of claim 12, further comprising a third structure over the first structure, the third structure being the same as the second structure.

15. The display apparatus of claim 14, wherein a polarization direction of the first structure is opposite to a polarization direction of the second structure and a polarization direction of the third structure.

16. The display apparatus of claim 1, wherein the first passivation layer has an embossing shape including the plurality of concave portions and the plurality of convex portions formed with an embossing roller.

17. A display apparatus, comprising:
a display panel configured to display an image; and
a sound generating device on a rear surface of the display panel, the sound generating device being configured to vibrate the display panel to generate a sound,
wherein the sound generating device comprises:
a first structure comprising a plurality of first parts and a plurality of second parts alternatingly arranged in parallel on the same plane; and
a passivation layer over or under the first structure, and
wherein each of the plurality of first parts comprises a piezoelectric material,
wherein each of the plurality of second parts comprises a flexible material,
the passivation layer includes a plurality of concave portions, and
wherein the plurality of concave portions are disposed correspondingly to the first part, or are disposed correspondingly to the first part and the second part.

18. The display apparatus of claim 17, wherein each of the plurality of second material parts includes a polymer having flexibility.

19. The display apparatus of claim 17, wherein each of the plurality of second parts includes at least one of an organic piezoelectric material and an organic non-piezoelectric material.

20. The display apparatus of claim 19, wherein the organic piezoelectric material includes a material having an electrically active characteristic, and/or
wherein the organic non-piezoelectric material includes at least one of an acrylic polymer, a silicon-based polymer, and an epoxy-based polymer.

21. The display apparatus of claim 17, further comprising:
a plurality of convex portions under the plurality of concave portions,
wherein the passivation layer is under the first structure, and
wherein the plurality of concave portions and the plurality of convex portions are disposed correspondingly to the first part and the second part.

22. The display apparatus of claim 17, further comprising a second structure over or under the first structure, the second structure including a polymer piezoelectric material.

23. The display apparatus of claim 22, wherein:
the sound generating device is under the display panel;
the display panel comprises a display area and a bending area;
the sound generating device is at the display area and the bending area; and
the sound generating device comprises a curved surface along the bending area.

24. The display apparatus of claim 22, wherein the sound generating device is under the display panel, the display panel having a certain curvature radius, and
wherein the sound generating device is bent based on a curvature of the display panel.

25. The display apparatus of claim 22, wherein the sound generating device is under the display panel, and
wherein the sound generating device is disposed to be wound or unwound based on winding or unwinding of the display panel.

26. The display apparatus of claim 22, further comprising a third structure over the second structure, the third structure being the same as the first structure.

27. The display apparatus of claim 26, wherein a polarization direction of the second structure is opposite to a polarization direction of the first structure and a polarization direction of the third structure.

28. The display apparatus of claim 26, wherein:
the sound generating device is under the display panel, the display panel comprising:
a display area; and a bending area;
the sound generating device is at the display area and the bending area; and
the sound generating device comprises a curved surface along the bending area.

29. The display apparatus of claim 26, wherein:
the sound generating device is under the display panel, the display panel having a certain curvature radius; and
the sound generating device is bent based on a curvature of the display panel.

30. The display apparatus of claim 26, wherein:
the sound generating device is under the display panel; and
the sound generating device is disposed to be wound or unwound based on winding or unwinding of the display panel.

31. The display apparatus of claim 22, further comprising a third structure over the first structure, the third structure being the same as the second structure.

32. The display apparatus of claim 31, wherein a polarization direction of the first structure is opposite to a polarization direction of the second structure and a polarization direction of the third structure.

33. The display apparatus of claim 31, wherein:
the sound generating device is under the display panel, the display panel comprising:
a display area; and
a bending area;
the sound generating device is at the display area and the bending area; and
the sound generating device comprises a curved surface along the bending area.

34. The display apparatus of claim 31, wherein:
the sound generating device is under the display panel, the display panel having a certain curvature radius; and
the sound generating device is bent based on a curvature of the display panel.

35. The display apparatus of claim 31, wherein:
the sound generating device is under the display panel; and
the sound generating device is disposed to be wound or unwound based on winding or unwinding of the display panel.

* * * * *